United States Patent
Hsu

(10) Patent No.: US 8,299,351 B2
(45) Date of Patent: Oct. 30, 2012

(54) EPITAXIAL GROWTH OF III-V COMPOUNDS ON (111) SILICON FOR SOLAR CELLS

(75) Inventor: Chung Chi Hsu, Hong Kong (HK)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 920 days.

(21) Appl. No.: 12/391,502

(22) Filed: Feb. 24, 2009

(65) Prior Publication Data

US 2010/0212729 A1    Aug. 26, 2010

(51) Int. Cl.
*H01L 31/00* (2006.01)

(52) U.S. Cl. .......................................................... 136/255

(58) Field of Classification Search .................. 136/255, 136/261
See application file for complete search history.

(56) References Cited

U.S. PATENT DOCUMENTS

| | | | |
|---|---|---|---|
| 5,323,023 | A | 6/1994 | Fork |
| 5,760,426 | A | 6/1998 | Marx et al. |
| 6,045,614 | A | 4/2000 | de Lyon et al. |
| 6,673,646 | B2 | 1/2004 | Droopad |
| 6,951,819 | B2 | 10/2005 | Iles et al. |
| 7,169,619 | B2 | 1/2007 | Liang et al. |
| 7,211,852 | B2 | 5/2007 | Ramdani et al. |
| 7,342,276 | B2 | 3/2008 | Ooms et al. |
| 2004/0129200 | A1 | 7/2004 | Kouvetakis et al. |
| 2008/0257409 | A1 | 10/2008 | Li et al. |

OTHER PUBLICATIONS

Yamaguchi. M. "Multi-layer Solar Cells: Principles and Issues Relating to Development and Manufacturing", Toyota Technological Institute, Oct. 2, 2006.
Geisz et al., "40.8% efficient inverted triple-junction solar cell with two independently metamorphic junctions", Appl. Phy. Ltrs 93, 123505, 2008, Sep. 23, 2008.
King et al., "40% efficient metamorphic GaInP/GaInAs/Ge multijunction solar cells", Appl. Phy. Ltrs 90, 183516, May 4, 2007.
Wu et al., "Direct evidence of 8:9 commensurate heterojunction formed between InN and AlN on c plane", Appl. Phy. Ltrs 87 241916, Dec. 7, 2005.
Jimbo et al., "Development of new materials for solar cells in Nagoya Institute of Technology", Science and Technology of Advanced Materials 6 (2005) 27-33, Dec. 9, 2004.
Yamaguchi. M., Takamoto et al., "Super-high-efficiency Multi-junction Solar Cells", Prog. Photovolt: Res. Appl. 2005; 13:125-132, 2005.

*Primary Examiner* — Jennifer Michener
*Assistant Examiner* — Dustin Q Dam
(74) *Attorney, Agent, or Firm* — Stuart T. Auvinen; gPatent LLC

(57) ABSTRACT

A multi-junction device can be used as a high efficiency solar cell, laser, or light-emitting diode. Multiple epitaxial films grown over a substrate have very low defect densities because an initial epitaxial layer is a coincidence-site lattice (CSL) layer that has III-V atoms that fit into lattice sites of Silicon atoms in the substrate. The substrate is a Si (111) substrate which has a step height between adjacent terraces on its surface that closely matches the step height of GaAs (111). Any anti-phase boundaries (APBs) formed at terrace steps cancel out within a few atomic layers of GaAs in the (111) orientation since the polarity of the GaAs molecule is aligned with the (111) direction. A low CSL growth temperature grows GaAs horizontally along Si terraces before vertical growth. Tunnel diode and active solar-cell junction layers can be grown over the CSL at higher temperatures.

20 Claims, 16 Drawing Sheets

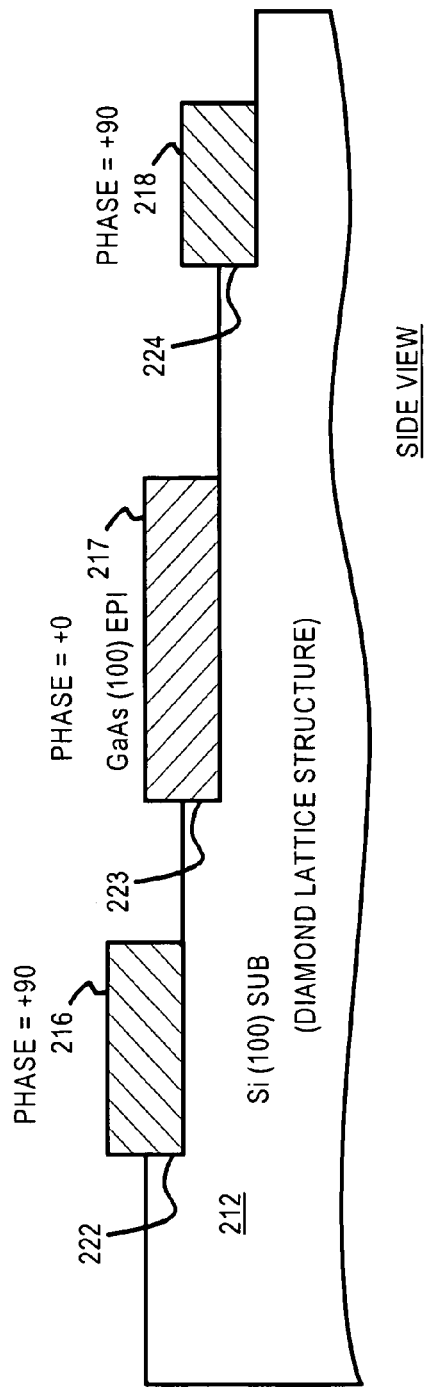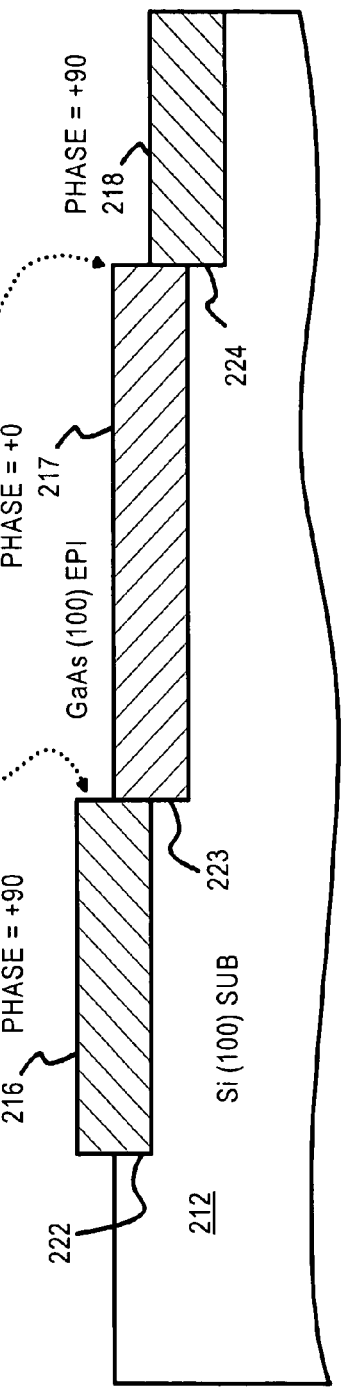
FIG. 5A PRIOR ART
FIG. 5B PRIOR ART

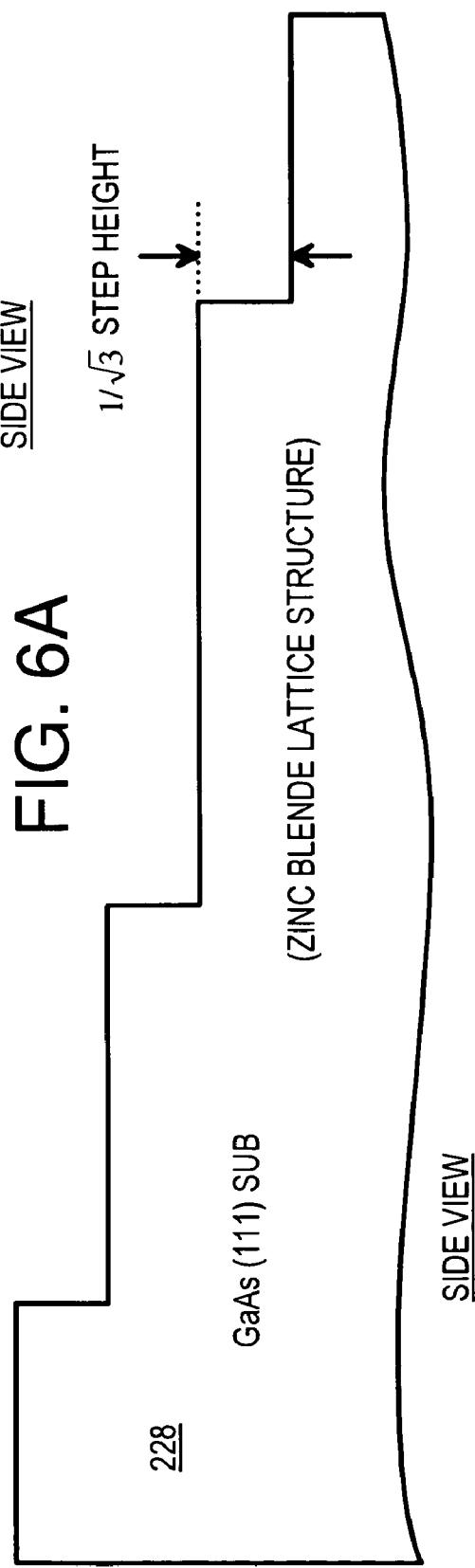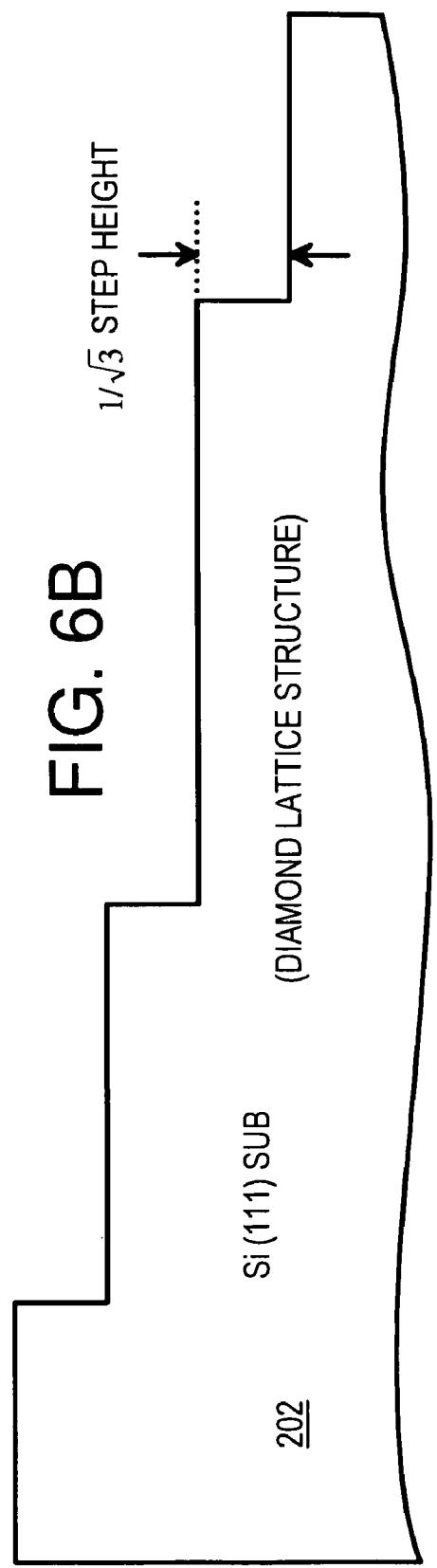

As FROM GaAs CSL DIFFUSES INTO Si SUB TO FORM N+ REGION IN Si

BOTTOM PN-JCN CELL IN Si SUB

EPITAXIAL GROWTH OF III-V COMPOUNDS ON (111) SILICON FOR SOLAR CELLS

FIELD OF THE INVENTION

This invention relates to solar cells, and more particularly to growing low-defect III-V layers on Silicon substrates

BACKGROUND OF THE INVENTION

Solar cells have been made from a wide variety of materials, including polycrystalline silicon, germanium, and III-V compounds such as Gallium-Arsenide (GaAs), Indium Phosphide (InP), and others in various combinations. Solar cells have a p-n junction that absorbs photons of light that match the bandgap energy of that p-n junction, which depends on the exact semiconductor material used. Electron-hole pairs are created when photons are absorbed, and these flow as current generated by the solar cell.

Semiconductor materials such as silicon (Si) and GaAs can be grown as large crystals and sliced into thin wafers that act as substrates. One or more epitaxial or epi layers can be grown on the wafer substrate. For example, a GaAs epi layer can be grown on a silicon wafer substrate.

Wafer substrates can have different orientations. FIG. 1 shows (111) and (100) planes in a crystal. FIG. 1 shows a face-centered-cubic (FCC) structure that is repeated in three dimensions in a FCC crystal. The six surfaces of the FCC cube are (100) surfaces that define (100) planes, or planes parallel or perpendicular to (100). If a grown crystal is cut along the (100) plane, it is considered to be a (100) substrate. The flat surface of the (100) substrate is parallel to one of the (100) planes.

The (111) plane passes through atoms 902, 904, 906 at 3 of the 8 corners of the FCC cube. A crystal cut along this plane is considered to be a (111) substrate. The flat surface of the (111) substrate is parallel to the (111) plane.

In semiconductor manufacturing wafers of (100) silicon are commonly used, although (111) silicon is sometimes used. Silicon has a diamond structure that has two interpenetrating FCC structures that are offset from one another by ($\frac{1}{4}$, $\frac{1}{4}$, $\frac{1}{4}$), where 1 is the distance along one side of the FCC cube.

GaAs has a different crystal structure than silicon. GaAs has a zincblende crystal structure with two inter-penetrating FCC structures, one for Ga atoms and the other for As atoms. In the GaAs zincblende crystal structure the As FCC structure is ($\frac{1}{4}$, $\frac{1}{4}$, $\frac{1}{4}$) away from the Ga FCC structure. Since GaAs has both Ga and As atoms, its crystal structure is polarized in the (111) direction.

FIG. 2 shows a silicon epi layer grown on a silicon substrate. When the silicon epi layer is grown, such as by silane gas in a gas-phase reactor, the silicon atoms form the gas attach to the silicon atoms exposed on the surface of the silicon substrate to grow the epi layer. Several atomic layers are grown as the epi layer.

The lattice constant A of the silicon substrate is the same as the lattice constant B of the silicon epi layer, since the epi layer is made of the same material as the substrate. Also, the orientation of the epi layer matches that of the substrate when the epi growth is controlled. The density of crystal defects in the epi layer can be very low, perhaps matching or even exceeding that of the substrate.

FIG. 3 shows a GaAs epi grown on a Si substrate. GaAs does not have exactly the same lattice constant as Si. For example, only 25 Ga and 25 As atoms may fit in the same amount of linear space as 26 Si atoms. Silicon's lattice constant A is slightly smaller than GaAs's lattice constant B. This slight mis-match is ultimately caused by the difference in atomic sizes and properties of Ga, As, and Si.

When GaAs is grown as an epi layer over a Si substrate, such as in a chemical-vapor-deposition (CVD) reactor, the Ga and As atoms may initially have the same spacing A as the Si atoms in the substrate. However, after a few layers of GaAs are grown, the lattice strain from the difference in lattice constants causes the GaAs lattice to adjust back to the spacing of its lattice constant B. This creates a dislocation. For example, there may be one such dislocation for every 26 Si atoms, since there are only 25 Ga and 25 As atoms in the same linear spacing. The density of dislocations may be proportional to the lattice mismatch.

These dislocations are undesirable since they can reduce the efficiency of a solar cell. Dislocations can trap electron-hole pairs, allowing them to recombine and reduce the current produced by the solar cell. Dislocations can also increase resistance to current flow. The stress due to lattice mismatch can cause bowing and warping of the whole wafer during or after epitaxial layer growth, which is also undesirable.

FIGS. 4A-B highlight differences in step height at terraces in (100) silicon and GaAs substrates. In FIG. 4A, GaAs (100) substrate 230 has a zincblende lattice structure. GaAs (100) substrate 230 is cut in the (100) orientation. However, the cut is not exactly parallel to the (100) crystal planes, and may be off by a small angle, such as 0.5 degree. This non-exact cut produces a vicinal substrate surface.

The misorientation from an exact orientated singular surface causes steps and ledges on a vicinal surface. The vicinal surface has flat areas known as terraces 244 that are atomically flat. Steps 242 are ledges between terraces 244. The height of these steps 242 depends on the lattice structure, orientation, and substrate material. For example, the GaAs (100) substrate has a step height of $\frac{1}{2}$ of the lattice constant.

FIG. 4B shows Si (100) substrate 212 which also has a vicinal surface. Si (100) substrate 212 has a diamond structure. Due to the diamond structure, steps 222 between terraces 246 have a step height of only $\frac{1}{4}$ of the lattice constant. Thus Si (100) substrate 212 has a step height of only $\frac{1}{4}$ while GaAs (100) substrate 230 has a step height of $\frac{1}{2}$.

GaAs has to have layers for both Ga and As atoms to be stable, whereas Si needs only one layer of Si for stability. Thus the step height of GaAs is double that of Si. The roughly double-size step height of GaAs (100) substrate 230 relative to Si (100) substrate 212 makes is difficult to grow low-defect GaAs epi layers on Si (100) substrate 212.

FIGS. 5A-C highlight defects created when GaAs is grown on Si (100) substrates. Epitaxial layers first grow from steps rather than from the terraces of a vicinal substrate. These steps provide a nucleation site that allows gas-phase atoms to adhere to the substrate and begin growth of the epitaxial layer.

In FIG. 5A, Si (100) substrate 212 is exposed to a gas mixture that provides Ga and As atoms, such Tri-methyl-gallium gas and Arsine gas. Ga and As atoms are first deposited at and adhere to steps 222, 223, 224 and begin forming GaAs epi films 216, 217, 218. These GaAs epi films 216, 217, 218 grow outward from steps 222, 223, 224 along the terraces of Si (100) substrate 212.

Since GaAs has a step height of $\frac{1}{2}$, while Si has a step height of $\frac{1}{4}$ on the (100) orientation, as shown in FIGS. 4A-B, GaAs epi films 216, 217, 218 grow in a layer that is $\frac{1}{2}$ of the lattice constant thick, or double the height of silicon steps 222, 223, 224. This double-height step of GaAs causes GaAs epi films 216, 217, 218 to extend above the top of steps 222, 223, 224 as shown in FIG. 5A.

Since GaAs has both Ga and As atoms, its crystal is polarized in the (111) direction. Adjacent Silicon step terraces have different surface reconstruction that causes GaAs layers grown on adjacent terraces to have different orientations, one turned 90 degree from the other.

As growth of the epi films continues along the terraces, outward from steps 222, 223, 224, eventually the edge of the terrace is reached. In FIG. 5B, GaAs epi film 216 has grown across its terrace, reaching the end of the terrace at step 223. Likewise, GaAs epi film 217 has grown to the end of its terrace at step 224. GaAs epi film 216 has grown to the right along the terrace to touch adjacent GaAs epi film 217 at step 223. Likewise, GaAs epi film 217 has grown to the right along the terrace to touch adjacent GaAs epi film 218 at step 224.

Since GaAs epi films 216, 217 have opposite crystal phases, GaAs epi film 216 cannot continue growing to the right over GaAs epi film 217. Also, GaAs epi film 217 has a ¼ step height relative to the terrace of Si (100) substrate 212. This ¼ height step blocks further growth to the right of GaAs epi film 216 beyond step 223 and over GaAs epi film 217. Instead of continuing to grow sideways, GaAs epi films 216, 217, 218 grow upward after reaching the edge of the terraces, as shown in FIG. 5C.

Since GaAs epi films 216, 217 have opposite crystal phases, a boundary between GaAs epi films 216, 217 is formed within the crystal as the crystal phase changes from +90 degrees to +0 degrees. This boundary is known as an anti-phase boundary (APB). An APB also is formed between GaAs epi films 217, 218 over step 224.

APB's are a type of stacking fault. These phase boundaries are propagated upward in the new epi layer as GaAs epi films 216, 217, 218 grow, as shown in FIG. 5C. These APB's were formed due to the crystalline nature of a compound of two kinds of atoms (Ga and As) growing on an elemental substrate having only 1 kind if atom (Si). These APB's are undesirable since they are a type of defect in the epi crystal.

FIGS. 6A-B highlight similarities in step heights of (111)-orientated silicon and Gallium-Arsenide. In FIG. 6A, a vicinal surface of GaAs (111) substrate 228 has a step height of $1/SQRT(3)$ of the lattice constant of GaAs, or about 0.577 of the lattice constant of GaAs. In FIG. 6B, a vicinal surface of Si (111) substrate 202 has a step height of the reciprocal of the square root of 3, $1/SQRT(3)$, of the lattice constant of Si, or about 0.577 of the lattice constant of Si. Since the lattice constants of Si and GaAs are near each other, although not exactly equal, these step heights for Si (111) substrate 202 and GaAs (111) substrate 228 are quite close to each other. In contrast, FIGS. 4A-B showed that the step height of GaAs was about double that of Si for the (100) orientation. Thus a much better match of step heights of Si and GaAs occurs on the (111) surfaces than on the (100) surfaces.

FIGS. 7A-B highlight epitaxial layers of GaAs grown on a Si (111) substrate. In FIG. 7A, Si (111) substrate 202 is exposed to a gas that provides Ga and As atoms, such as Tri-methyl-gallium and Arsine gases. Ga and As atoms are first deposited at and adhere to steps 204 and begin forming GaAs epi films 206, 207. These GaAs epi films 206, 207 grow outward from steps 204 along the terraces of Si (111) substrate 202.

Since GaAs has a step height of $1/SQRT(3)$ of the GaAs lattice constant, while Si has a step height of $1/SQRT(3)$ of the Si lattice constant on the (111) orientation, as shown in FIGS. 6A-B, GaAs epi films 206, 207 grow in a layer that is close to the height of silicon steps 204. This similar-height step of GaAs causes GaAs epi films 206, 207 to be close to flush with the top of steps 204 as shown in FIG. 7A.

GaAs crystal is polarized. GaAs can be though of as a FCC crystal lattice of a GaAs molecule, with one GaAs molecule occupying each lattice point in the FCC lattice. However, the GaAs molecule is polarized so that the Ga atom is in the (111) direction while the As atom is in the (−1 −1 −1) direction.

The Burgers vector of the FCC structure is ½<110>. On the (111) surface with GaAs on top of Si in a coincidence site lattice, for every 25 Ga (or As) atoms, there are 26 Si atoms. These two rows of atoms form a Burgers vector in one of the <110> directions parallel to the surface. In a triangle in the (111) direction with 25 Ga (or As) atoms at each side of the triangle with 26 Si atoms right below, we have 3 Burgers vectors in 3 different <110> directions all parallel to the (111) surface on this triangle, and they cancel out. Burgers vectors with 3 different <110> directions cancel out at the interface between the Si substrate and the GaAs epi layer.

In a more complicated structure such as zincblende or diamond, ½<110> dislocations might be separated into ⅙<112> partial dislocations. These ⅙<112> partial dislocations also cancel out (See C. B. Carter, G. Anderson, F. Ponce Phil. Mag. A 63 (1991) 279). Thus, in a coincidence site lattice in the <111> direction, all dislocations are cancelled at the interface, and do not propagate into the epitaxial layers. If no additional defects are introduced through lattice mismatch and APBs, the epitaxial layer should have the same defect density as the starting substrate.

As growth of the epi films continues along the terraces, outward from steps 204, eventually the edge of the terrace is reached. In FIG. 7B, GaAs epi film 206 has grown across its terrace, reaching the end of the terrace at the next step 204. GaAs epi film 206 has grown to the right along the terrace to touch adjacent GaAs epi film 207 at step 204.

Since GaAs epi films 206, 207 have the same crystal phase, GaAs epi film 206 can continue growing to the right over GaAs epi film 207. Also, GaAs epi film 207 has a nearly equal step height relative to the terrace of Si (111) substrate 202. This nearly equal step height allows further growth to the right of GaAs epi film 206 beyond step 204 and over GaAs epi film 207. GaAs epi films 206, 207 can also grow upward after reaching the edge of the terraces.

Since GaAs epi films 206, 207 have identical crystal phases, no boundary between GaAs epi films 206, 207 is formed within the crystal at steps 204, unlike the case of Si (100) substrate 212 shown in FIG. 5B. The anti-phase boundary (APB) and any stacking faults have been avoided.

The inventor has realized that the much better match of step heights and the lack of multiple crystal phases of Si (111) substrate 202 should yield GaAs epitaxial layers with much lower defect densities than for Si (100) substrate 212. The lower defect densities should produce higher efficiency devices such as solar cells, lasers, and light-emitting diodes.

FIG. 8 is a graph of solar cell efficiency as a function of dislocation density. For a solar cell within a single p-n junction, the efficiency is about 25% when the dislocation density is less than $5\times10^5$ defects per $cm^2$ of surface area. However, when defects increase above $5\times10^5$, the efficient drops off. Efficiency drops to about 7% for high defect densities such as $10^8$.

Efficiencies are higher for solar cells with multiple p-n junctions. The multi-junction efficiency is about 36% when the dislocation density is less than $5\times10^5$ defects per $cm^2$ of surface area. When defects increase above $5\times10^5$, the efficient drops off to about 19% for high dislocation densities such as $10^8$.

Of course, the actual efficiency of any solar cell varies, but the effect of dislocation density on efficiency should be similar.

Solar cells, lasers, and light-emitting diodes that are constructed from GaAs epitaxial layers grown over Si (111) substrates are thus desirable. Low-defect-density epi layers grown over (111) silicon substrates is desirable since multi-junction solar cells having many epi layers could be produced with high efficiencies. Multiple layers of GaAs and other III-V and similar materials grown over Si (111) substrates is desired.

BRIEF DESCRIPTION OF THE DRAWINGS

FIGS. 5A-C highlight defects created when GaAs is grown on Si (100) substrates.

FIGS. 6A-B highlight similarities in step heights of (111)-orientated silicon and Gallium-Arsenide.

DETAILED DESCRIPTION

The present invention relates to an improvement in epitaxial layer growth for solar cells and other applications. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
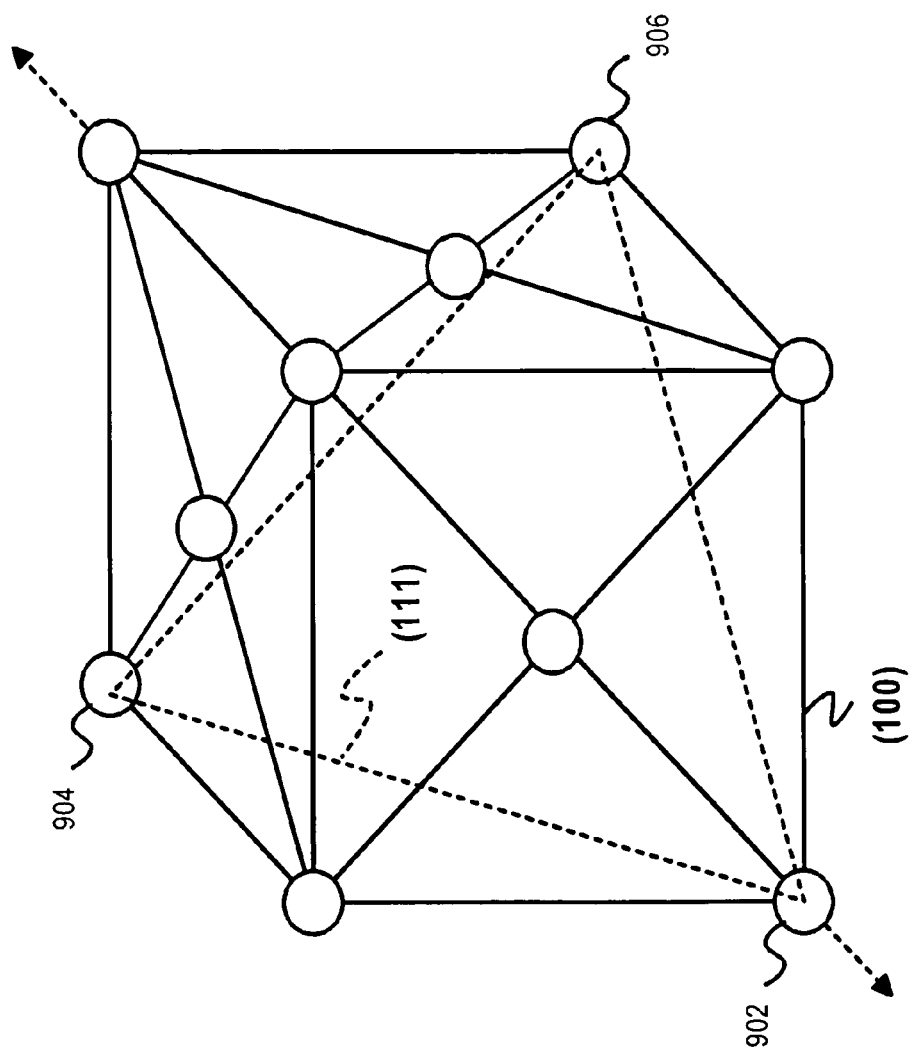
FIG. 1 shows (111) and (100) planes in a crystal.
Figure 2:
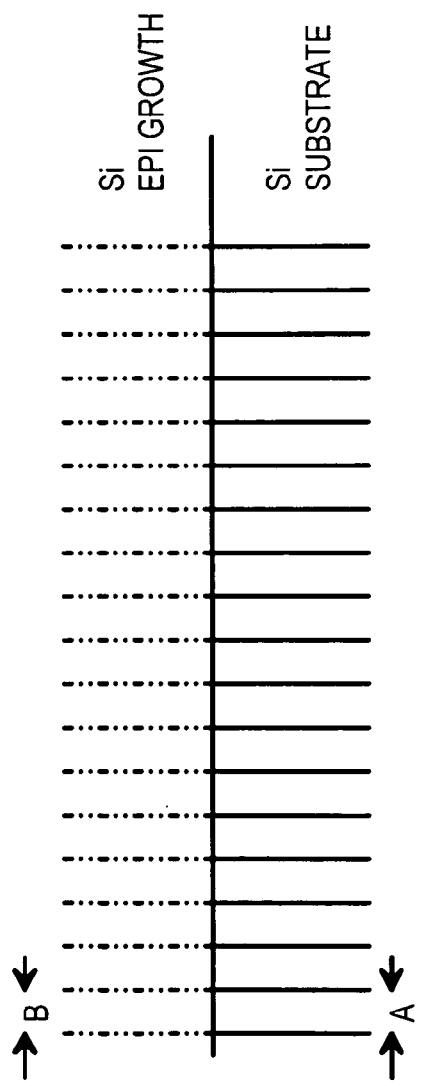
FIG. 2 shows a silicon epi layer grown on a silicon substrate.
Figure 3:
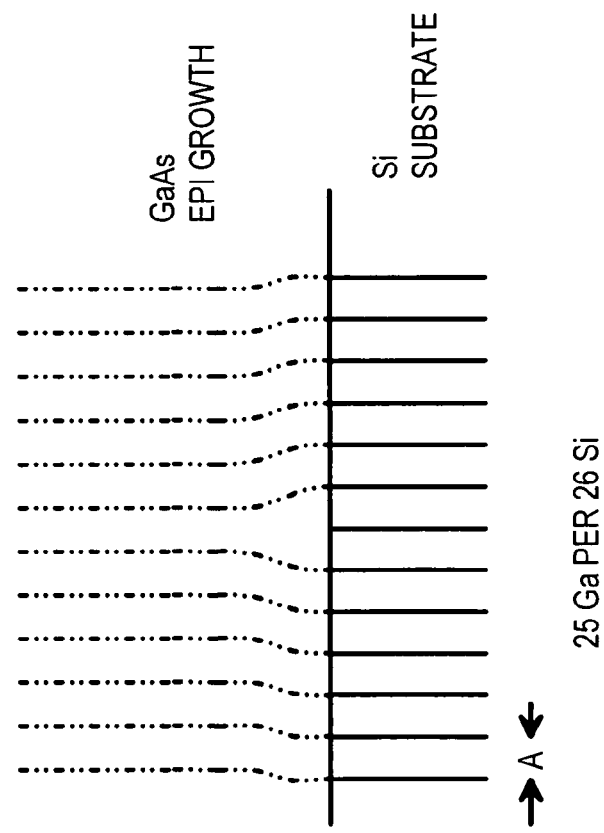
FIG. 3 shows a GaAs epi grown on a Si substrate.
Figure 4A:
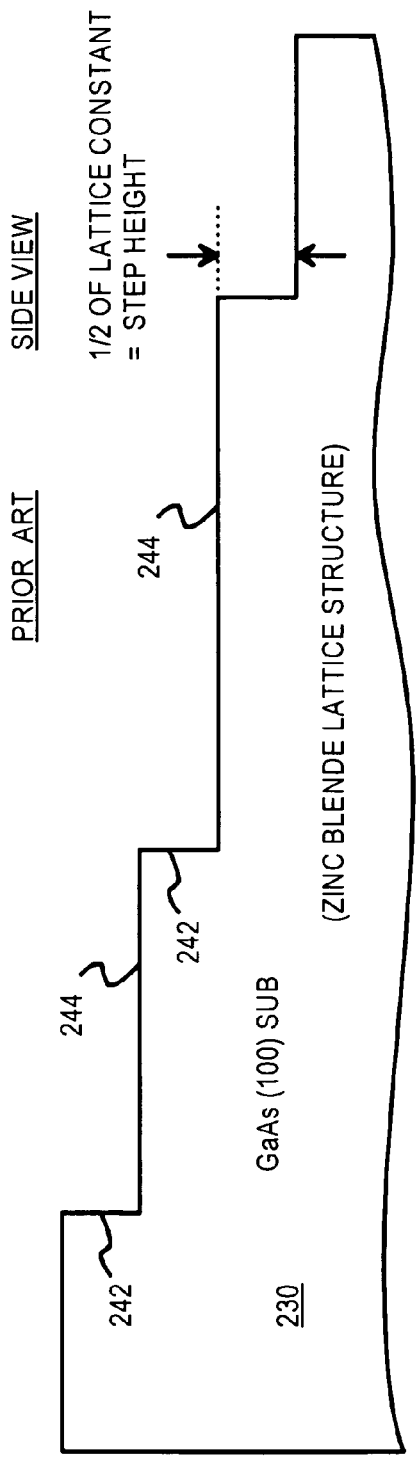
FIGS. 4A-B highlight differences in step height at terraces in (100) silicon and GaAs substrates.
Figure 4B:
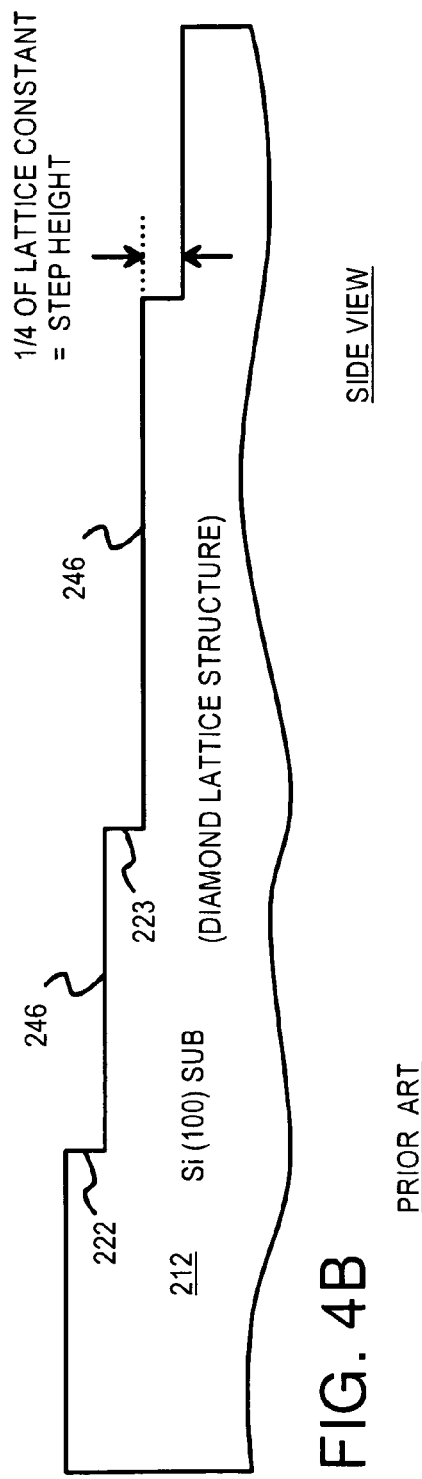
Figure 5C:
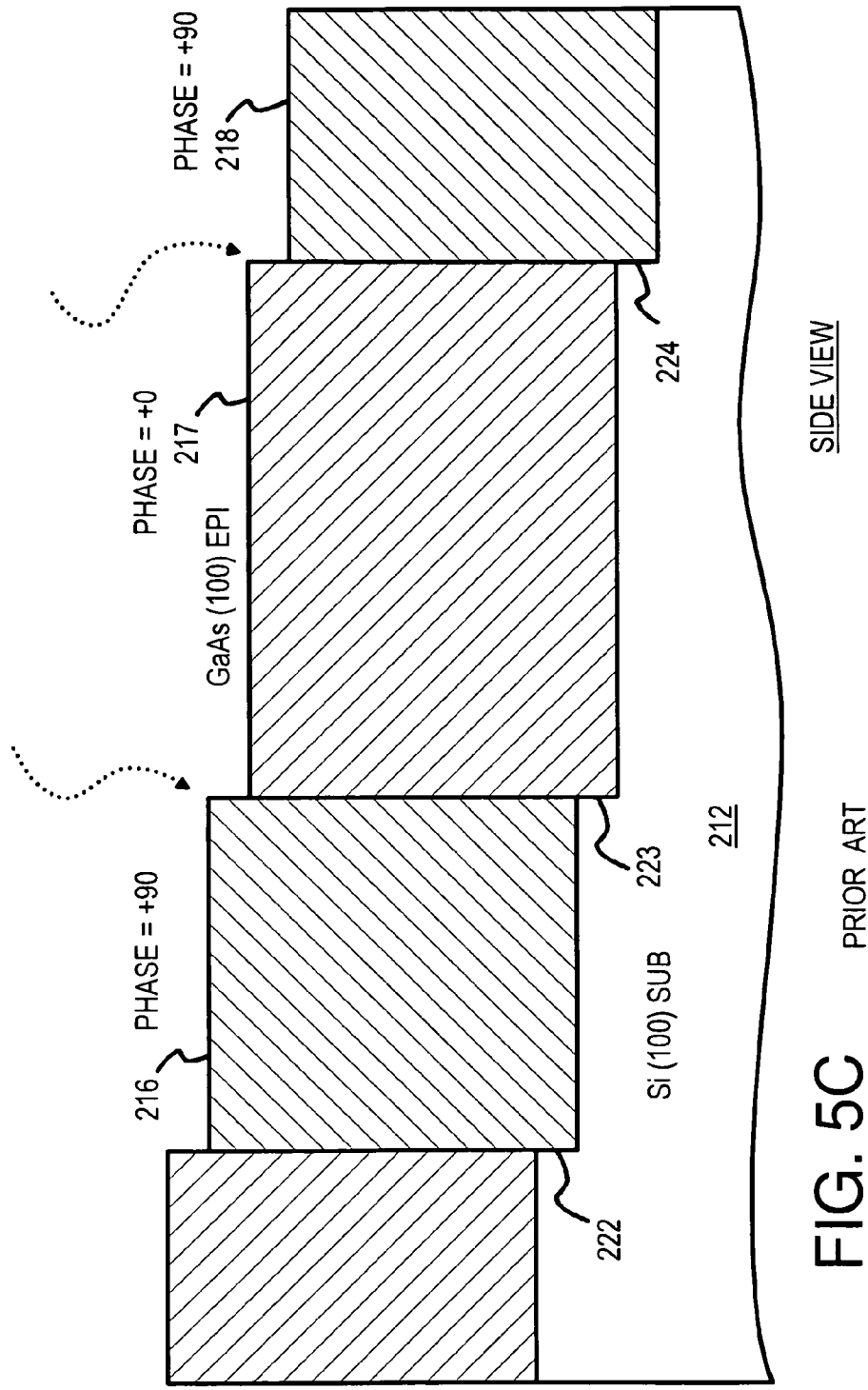
Figure 7A:
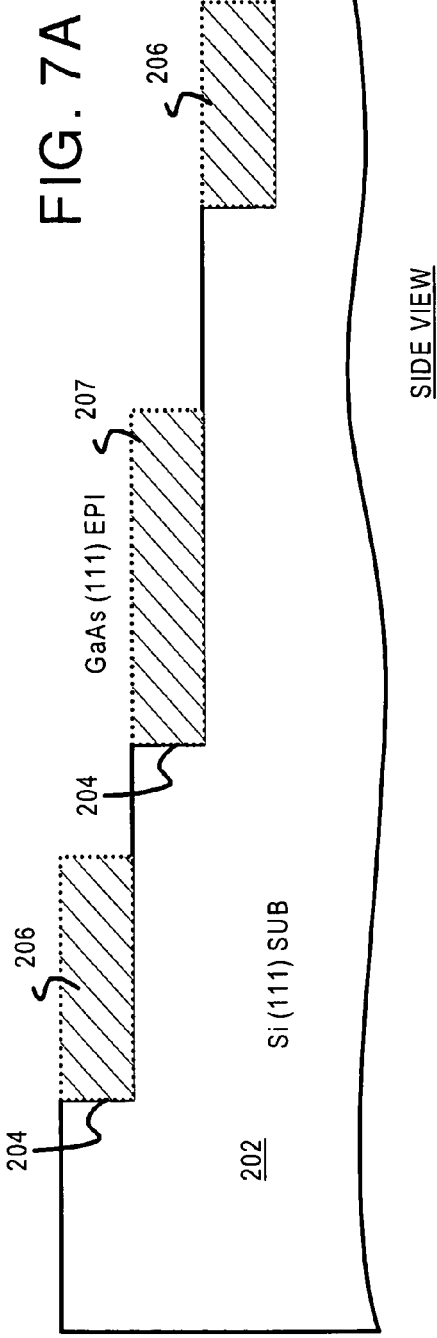
FIGS. 7A-B highlight epitaxial layers of GaAs grown on a Si (111) substrate.
Figure 7B:
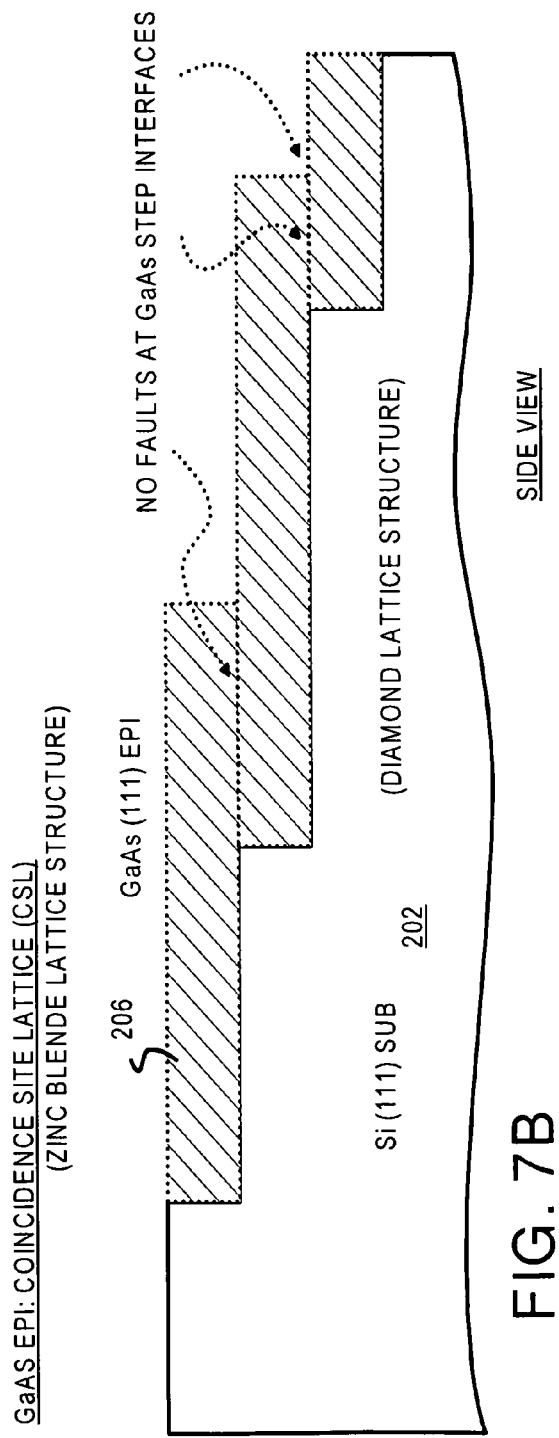
Figure 8:
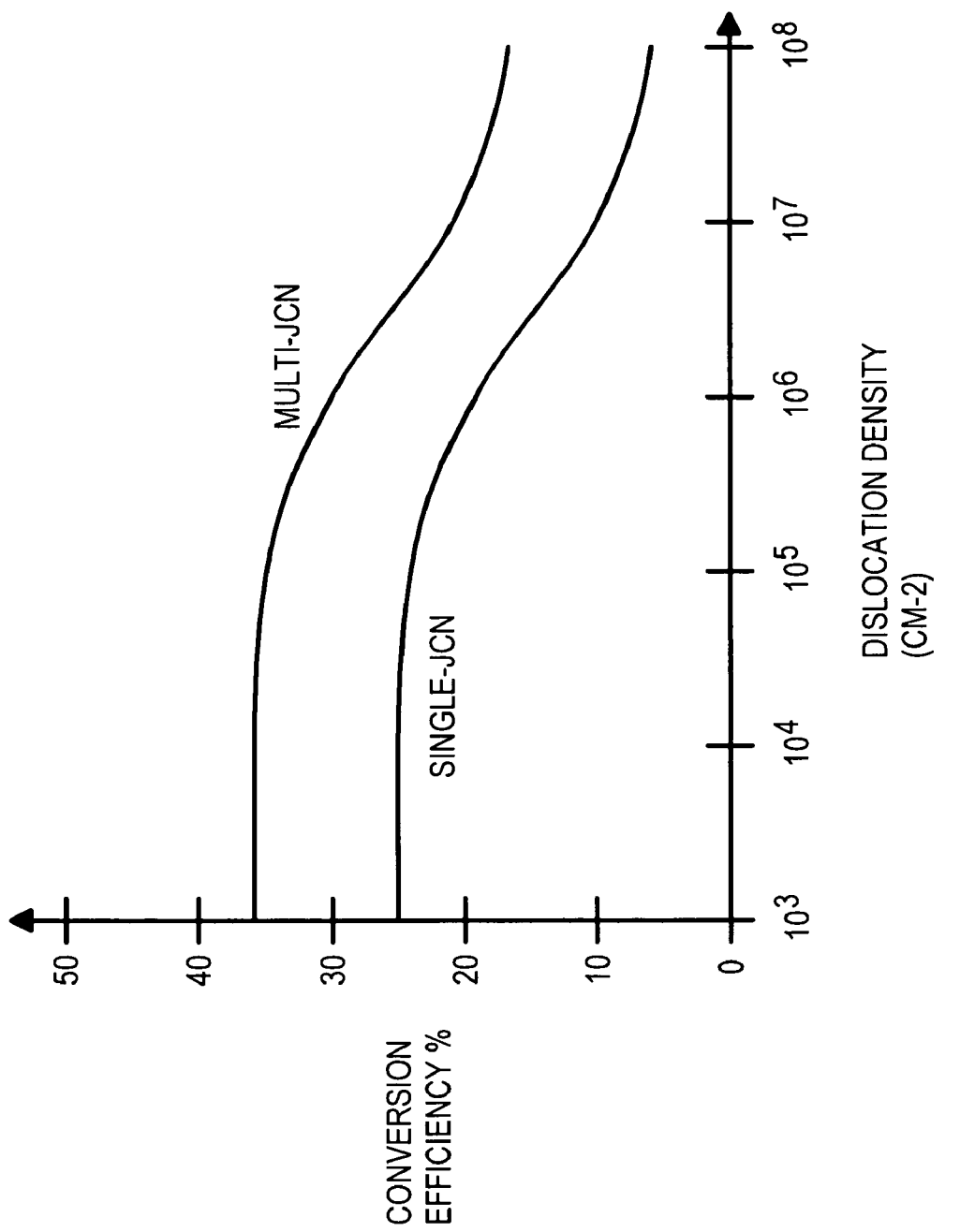
FIG. 8 is a graph of solar cell efficiency as a function of dislocation density.

The inventor has realized that the much better match of step heights and the lack of multiple crystal phases of GaAs grown on Si (111) substrate 202 (FIG. 7B) should yield GaAs epitaxial layers with much lower dislocation and defect densities than for GaAs grown on Si (100) substrate 212 (FIG. 5B). The lower defect densities should produce higher efficiency devices such as solar cells, lasers, and light-emitting diodes. In FIG. 7B, GaAs epi films 206, 207 formed a coincidence-site lattice (CSL) over Si (111) substrate 202 due to the good match of silicon and Gallium-Arsenide crystal properties at the (111) orientation.

Figure 9:
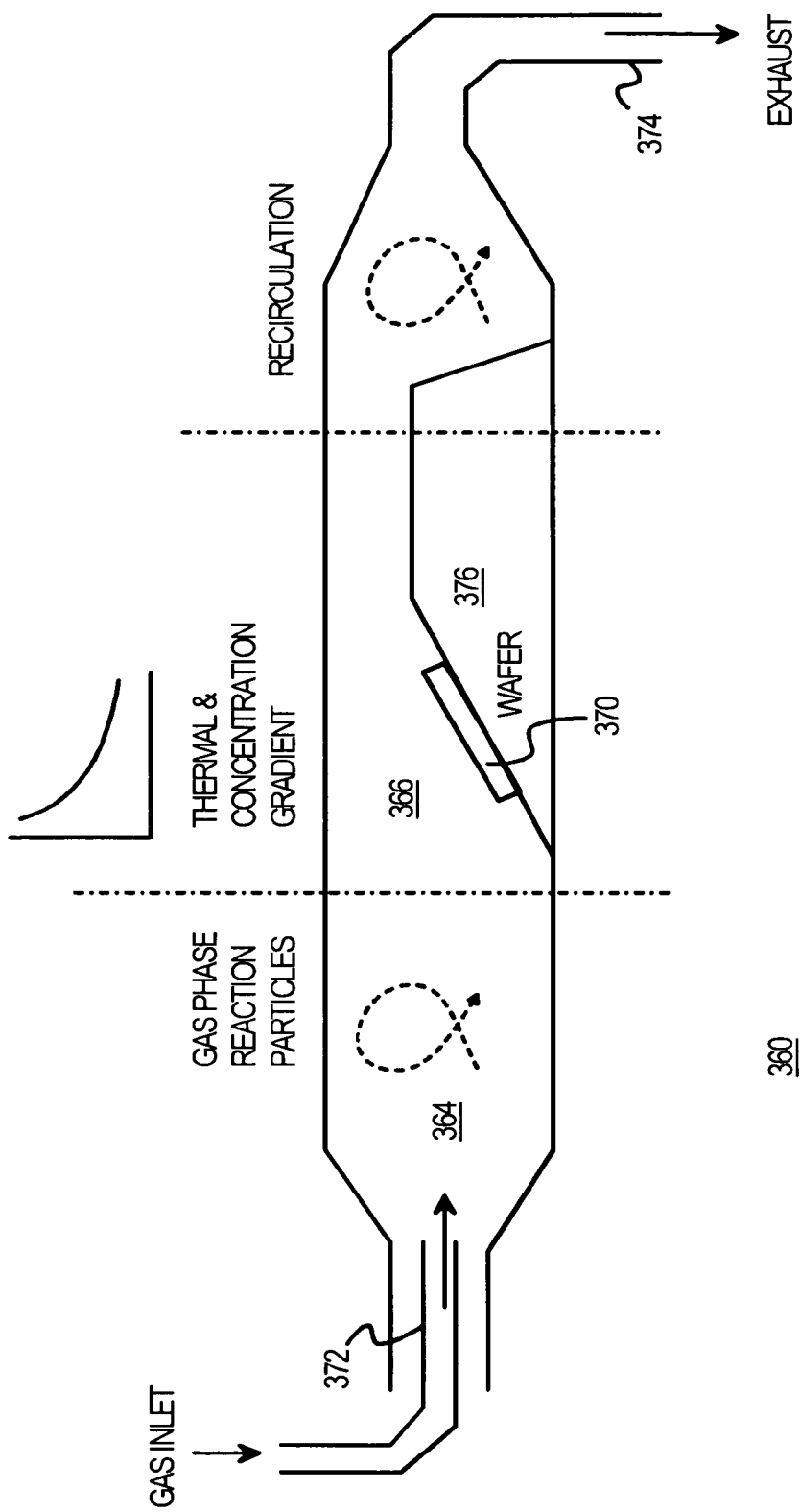
FIG. 9 shows a Metal-Organic Chemical-Vapor-Deposition (MOCVD) reactor for growing III-V epitaxial layers on silicon substrates.

FIG. 9 shows a Metal-Organic Chemical-Vapor-Deposition (MOCVD) reactor for growing III-V epitaxial layers on silicon substrates. Reactor 360 has gases flowing from gas inlet 372, over wafer 370, and out exhaust 374, which may be connected to a vacuum pump to provide low pressure in reactor 360. Multiple gas inlets may be combined in a manifold or directly send gas into reaction zone 364, where the gases can combine and/or break down before nearing wafer 370. Gases such as Arsine and Tri-methyl-gallium gas may be input through gas inlet 372.

Radiant or other heaters may heat either the gases through the wafer susceptor inside reactor 360, or wafer 370 directly. A thermal and/or concentration gradient may be established over wafer 370 in deposition zone 366 as the gas reactants pass over wafer 370. Wafer 370 may be Si (111) substrate 202 shown earlier with steps that the gas reactants adhere to and react to form the epi layer. The exact kinds and concentration of reactant gases in deposition zone 366 determines the composition of the epi film being deposited on wafer 370. The gas mixture's composition may be changed over time to form multiple epi layers having different chemical compositions, such as shown later in FIGS. 11-15.

The temperature of wafer 370 on holder 376 may also be adjusted to speed up or slow down epi growth. For example, a lower temperature can be initially used while the initial layer of GaAs grown on Si (111) substrate (wafer 370) to achieve a coincidence site lattice matching and fewer defects at the silicon-GaAs interface. Later, the temperature may be increased to speed up deposition rates for thicker films being deposited on top of this initial GaAs epi layer.

At the normal growth temperature, the surface diffusing species might be too energetic for two-dimensional layer-by-layer epitaxial growth on a mismatched substrate, making dislocation cancellation difficult. On a mismatched substrate, the growth mode is 3-dimensional to release the strain energy at a normal growth temperature. Without mismatching, the growth mode remains 2-dimensional at the normal growth temperature. After forming the initial layer of GaAs on Si (the coincident site lattice, CSL) with a low growth temperature, where the grown layers have no more dislocations than the starting substrate due to the difference of the lattice constants, further growth can be conducted at the normal growth temperature and layers with optimized physical properties can be obtained.

The normal growth temperature for growing epitaxial films is between 650 and 700 degrees. The low growth temperature for growing the initial coincidence site lattice layer is between 425 and 450 degrees. Other temperatures may be substituted.

Figure 10:
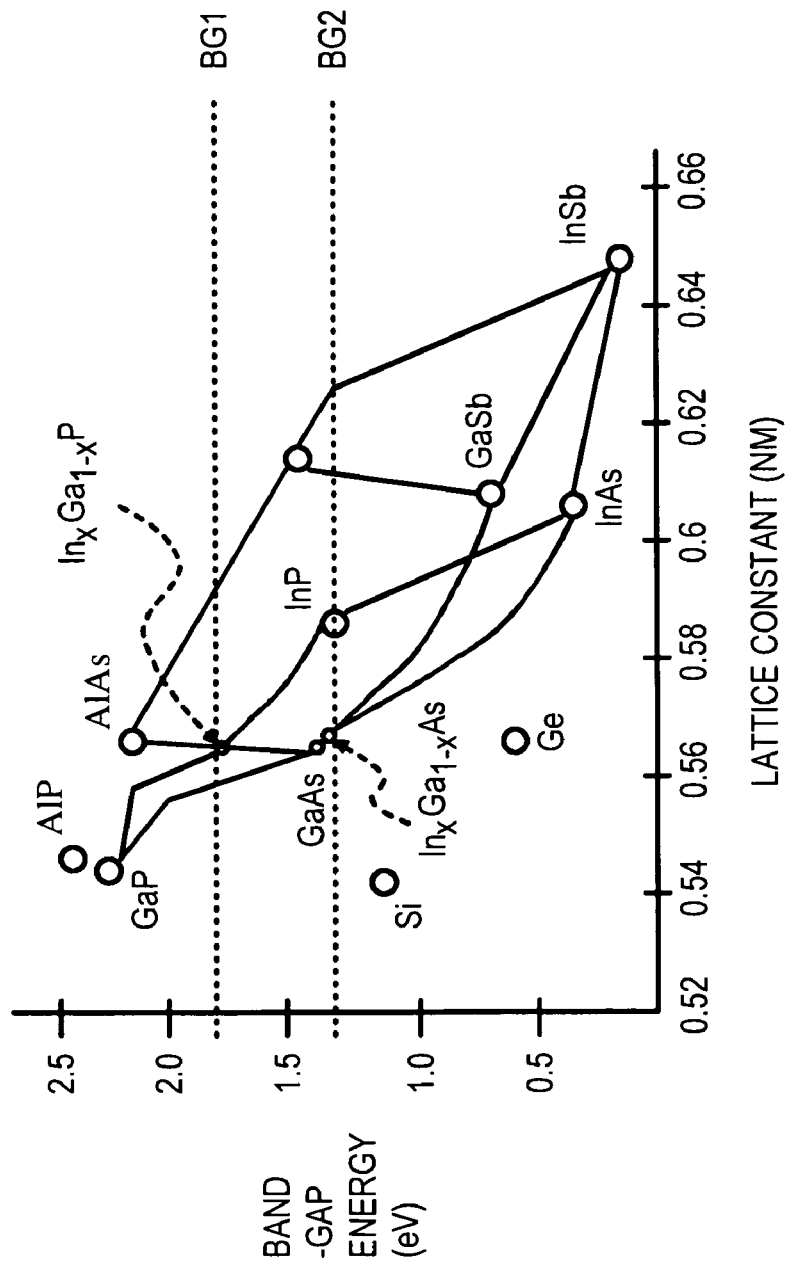
FIG. 10 is a graph showing band gap energies and lattice constants as a function of chemical composition.

FIG. 10 is a graph showing band gap energies and lattice constants as a function of chemical composition. A variety of semiconductor materials may be deposited on the wafer in the MOCVD reactor of FIG. 9. Each material may have a different band-gap energy.

Higher band-gap energies require a shorter wavelength of the photons or light absorbed by the material in a solar cell. For example, Germanium (Ge) absorbs much longer wavelengths of light than does Silicon (Si) due to the lower band-gap energy of Ge than of Si. GaAs has a higher band-gap energy than Si, while other III-V materials such as GaP and AlAs require even shorter wavelengths and more energetic photons.

A multi-junction solar cell can be constructed from p-n junctions in multiple layers of different materials. Layers near the top of the device receive sunlight first and are usually chosen from higher bandgap materials to absorb the more energetic photons. Lower layers in the device receive photons that were not absorbed by upper layers, and lower bandgap materials are used for these lower layers to absorb less energetic photons of sunlight, or parts of the solar spectrum that are not energetic enough to be absorbed by the higher bandgap materials in the upper layers.

For example, an upper layer could use $In_XGa_{1-X}P$, where X is 0.5. This material has bandgap BG1 around 1.85 eV. A lower layer could use GaAs, which has a bandgap BG2 of 1.42 eV. The more energetic wavelengths of sunlight are absorbed by the upper $In_XGa_{1-X}P$ layer, while remaining longer wavelengths are absorbed by the underlying GaAs layer.

The exact bandgap and lattice constant may be varied by varying the exact composition of the material. For example, any bandgap between about 2.3 eV and 1.3 eV may be selected by varying the fraction X in $In_XGa_{1-X}P$, since $In_XGa_{1-X}P$ is on a line between GaP, which has a bandgap of 2.3 eV, and InP, which has a bandgap of 1.35 eV. The lattice constant increases as the fraction of Indium increases and that of Gallium decreases in $In_XGa_{1-X}P$, so a good lattice match with an underlying layer may also be achieved by varying the fraction X. A solar-cell designer can use other compounds and adjust their bandgaps and lattice constants in a similar manner. A variety of such compounds may be formed as epi layers using reactor 360 of FIG. 9, and their bandgaps and lattice constants measured to create a similar graph that can be useful in designing a multi-junction solar cell.

Figure 11A:
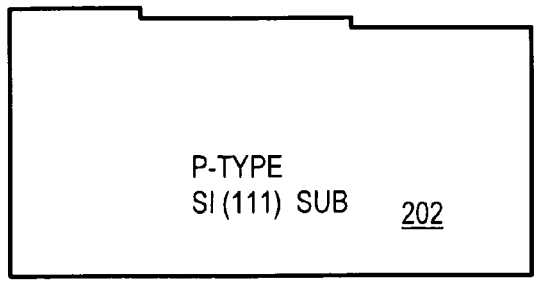
FIGS. 11A-E show growing GaAs layers on a Si (111) substrate to form a 2-junction solar cell.

FIGS. 11A-E show growing GaAs layers on a Si (111) substrate to form a 2-junction solar cell. In FIG. 11A, Si (111) substrate 202 is a p-type substrate having a resistivity of 0.1 to 0.2 ohm/cm. The substrate could be 200 microns or less in thickness, and could be in wafer form. Si (111) substrate 202 has a vicinal surface with steps and terraces, and may be 0.5 to 5 degrees off of a singular flat (111) surface.

Figure 11B:
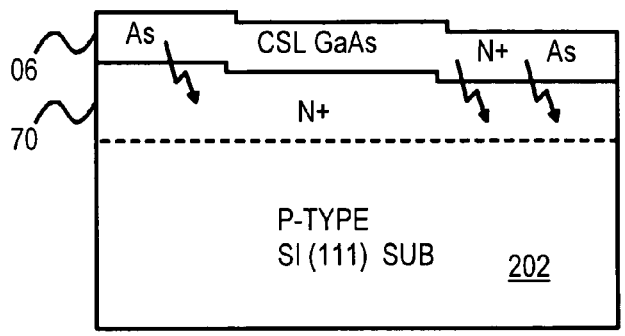

In FIG. 11B, N+ diffusion layer 270 is formed from the top surface of Si (111) substrate 202, by diffusion of As during the growth process after, the initial GaAs layer is grown. The As atoms from the initial CSL layer gas reactants in reactor 360 (FIG. 7) diffuse into Si (111) substrate 202 while GaAs epi film 206 and subsequent layers are being grown, GaAs epi film 206 is grown at a lower temperature, such as 425 to 450 degrees C. causing growth to be slow and 2-dimensional rather than 3-dimensional. In slower 2-dimensional growth, lattice strain in GaAs epi film 206 is released by forming a coincidence-site lattice (CSL) at the interface between Si and GaAs. The slow growth of GaAs epi film 206 is first sideways along the terraces rather than upward. If higher temperatures were used, growth would be upward and lattice strain would be released by covering over dislocations and defects as the fast-growing film grows upward. The lower temperature of the substrate may also reduce the energy of surface reactants, allowing them to bond to the exposed silicon lattice rather than diffuse over the grown GaAs surface.

Thus the lower growth temperature produces a lower-defect film with a coincidence-site lattice (CSL). GaAs epi film 206 is a CSL epitaxial layer with a low defect density. Ideally, the dislocation density of GaAs epi film 206 is about the same as that of Si (111) substrate 202 since few additional dislocations are created by the low-temperature CSL growth process and the good lattice matching of GaAs and Si (111).

Figure 11C:
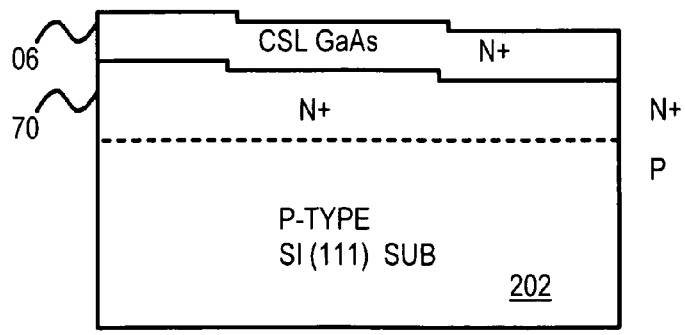

In FIG. 11C, N+ diffusion layer 270 and p-type Si (111) substrate 202 form an n-p junction within the silicon substrate. This p-n junction has a low defect density since it is formed in the starting substrate. The silicon p-n junction bandgap is about 1.1 eV. Si (111) substrate 202 acts as both an active cell and as a supporting element of the whole device.

Figure 11D:
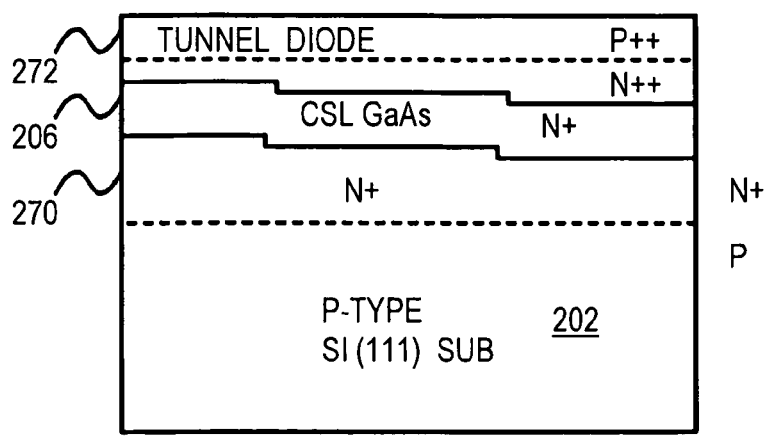

In FIG. 11D, tunnel diode layer 272 is grown on top of GaAs epi film 206. Since GaAs epi film 206 is a CSL with low defects, the lattice constant of the surface layer has been converted from that of silicon to that of GaAs, 5.65 Angstroms. This lattice constant is closer to that of other III-V alloys such as GaInP, AlGaAs, and AlInP. Thus a wide variety of materials may be grown on top of GaAs epi film 206.

Tunnel diode layer 272 has a highly-doped p-n junction. The high doping produces a very thin energy barrier in the junction. This barrier is so thin that electrons may tunnel through the barrier by quantum-mechanical tunneling. Current may flow through tunnel diode layer 272 in the reverse-biased direction. Thus tunnel diode layer 272 acts as a series resistance.

Tunnel diode layer 272 is useful in a multi-junction solar cell since it reverses the doping polarity of the surface layer. Before tunnel diode layer 272 is grown, GaAs epi film 206 is exposed at the surface, and GaAs epi film 206 has a n+ doping. Tunnel diode layer 272 has a n+ layer followed by a p+ layer, so p+ is exposed at the surface after tunnel diode layer 272 is grown. This polarity reversal by tunnel diode layer 272 allows another p-n junction to be grown that has the same direction of polarity and the underlying p-n junction in Si (111) substrate 202. Thus solar-generated currents in both p-n junctions are added together to increase the solar current produced in the multiple junction device.

Reactor 360 first grows a GaInP layer with a n+ doping, using Si as the dopant. This n+ layer is about 15 nm thick. Then reactor 360 grows a $Al_{0.37}GaAs$ layer with a p+ doping using Carbon as the dopant. This p+ layer is about 30 nm thick. Together these two layers form tunnel diode layer 272. The p+ and n+ doping are both about $3 \times 10^{19}$.

Figure 11E:
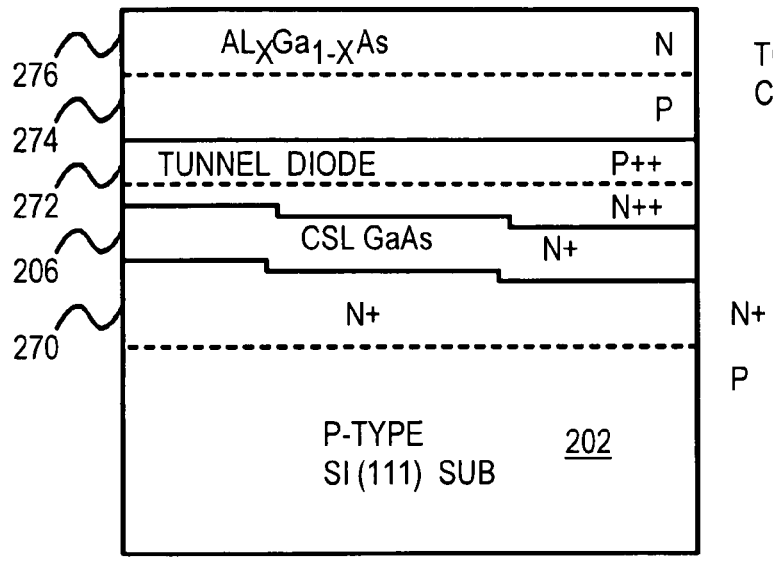

In FIG. 11E, the top solar cell is grown. Top cell p layer 274 is a $Al_{0.17}GaAs$ layer that is grown over tunnel diode layer 272, which has a $Al_{0.37}GaAs$ layer exposed on the surface, so the lattices almost match; the difference in alloys being a lower Al concentration by 0.20. Then top cell n layer 276 is grown, which is also a $Al_{0.17}GaAs$ layer, but with a n doping.

Top cell layers 274, 276 are much thicker than tunnel diode layer 272. Top cell p layer 274 is about 1.5 microns thick, with the exact thickness determined by current matching with the bottom cell in Si (111) substrate 202. The p-doping is $10^{17}$. Top cell n layer 276 is 50 to 100 nm thick, with the exact thickness determined by current matching with the bottom cell in Si (111) substrate 202. The n-doping is about $10^{18}$.

The exact alloy concentrations of the various layers may be adjusted and optimized. A graph such as shown in FIG. 10 shows how the bandgap energy and lattice constants vary with alloy composition. The alloy concentration of one layer may be adjusted to adjust its lattice constant to be closer to the lattice constant of the underlying layer to reduce dislocations and defects. Higher concentrations of Al tend to have higher bandgaps. Both the alloy concentrations and layer thickness can be adjusted and optimized for current matching between the 2 cells.

The top cell has a bandgap of about 1.65 eV, while the bottom cell in Si (111) substrate 202 has a bandgap of about 1.1 eV. The open circuit voltage Voc is about 2 V.

For current matching, the number of photons absorbed in the top cell must be equal to the number of photons absorbed in the bottom cell. With a sunlight concentration N, the open circuit voltage increases by 2kTlnN, or 0.32 V at 300 K with N=500.

It may be possible to reach a 38% efficiency at a high solar concentration with this structure. Some of the photo current is lost in the series resistance or absorbed by other passive elements of the cell.

For a single Si p-n junction cell, the typical photo current is between 40 mA and 42 mA/cm2. Dividing this current into two cells, current Jsc=20-21 mA. An even higher Jsc is possible since Si has surface UV absorption. For a 38% efficiency at N=500 concentration in the AlGaAs/Si structure of FIG. 11, i.e.

$$38\% = Jsc \times Voc \times F.F.$$

with Voc=2.32, fill factor F.F.=0.85, it would require Jsc=19.26 mA. This current density is realistically possible in this structure, taking into account of current loss in the passive elements of the structure.

Figure 12:
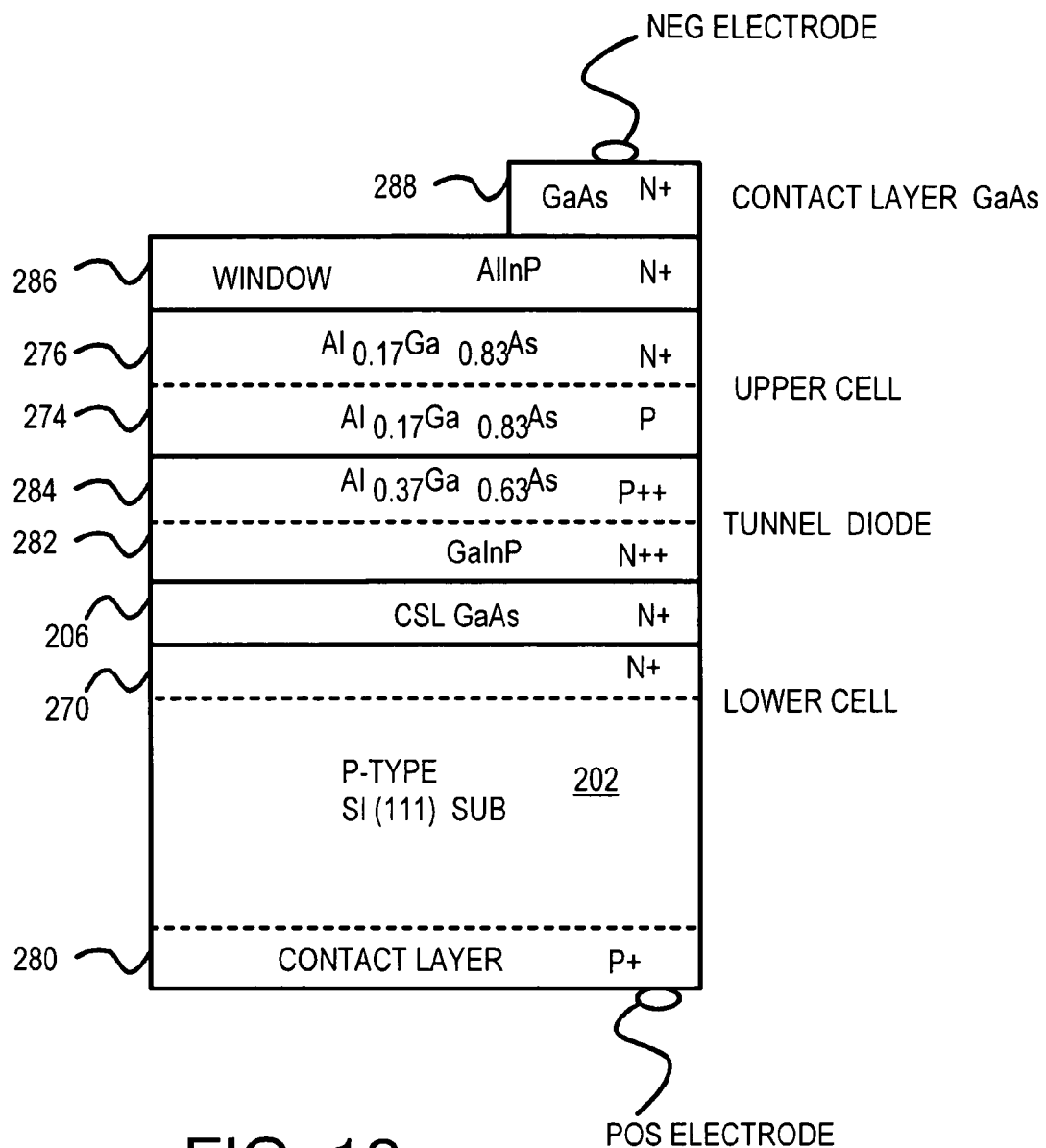
FIG. 12 is a diagram of a solar cell made with the process of Figs.

FIG. 12 is a diagram of a solar cell made with the process of FIGS. 11A-E. A positive electrode is bonded to the reverse side of Si (111) substrate 202, which has p+ contact layer 280 formed on it. P+ contact layer 280 may be formed by Al drive in at 350 degrees C., or through normal boron diffusion into silicon before the epitaxial growth in a separate furnace. N+ diffusion layer 270 is about 0.1 micron deep and was formed by As diffusing in as GaAs epi film 206 is slowly grown as a coincidence-site lattice (CSL). The good lattice match of Si (111) substrate 202 and GaAs on the (111) orientation produces few dislocations. Most dislocations cancel each other out within about 10 nm of the silicon surface. GaAs epi film 206 is about 5 to 10 nm in thickness.

A tunnel diode is formed by GaInP tunnel-diode layer 282, which has a n+ doping of about $3\times10^{19}$, and is 15 nm thick, and a $Al_{0.37}GaAs$ tunnel-diode layer 284, which has a p+ doping of about $3\times10^{19}$, and is 30 nm thick.

Some alloys of GaInP have a lattice constant that is close to that for GaAs, so GaInP tunnel-diode layer 282 matches closely with GaAs epi film 206. For example, a $Ga_{0.5}In_{0.5}P$ layer may be a good match, being halfway between GaP and InP in FIG. 10.

The upper cell is formed of top cell p layer 274 and top cell n layer 276. Top cell p layer 274 is a $Al_{0.17}GaAs$ layer with a p-type doping of about $1\times10^{17}$, and is about 1.5-micron thick. Top cell n layer 276 is a $Al_{0.17}GaAs$ layer with a n+ doping of about $1\times10^{18}$, and is about a 50-100 nm thick.

Window layer 286 is a 30 nm thick layer of AlInP with a n+ doping of $10^{18}$. Window layer 286 allows light to reach the underlying layers while allowing current to reach patterned contact layer 288. Patterned contact layer 288 blocks sunlight and is patterned such as by etching to cover only a small fraction of the surface of the device. Patterned contact layer 288 can be n+ GaAs, 100 to 500 nm thick, and may have a 10 nm thick n+ InGaAs layer on top. A negative electrode is bonded to patterned contact layer 288.

Figure 13:
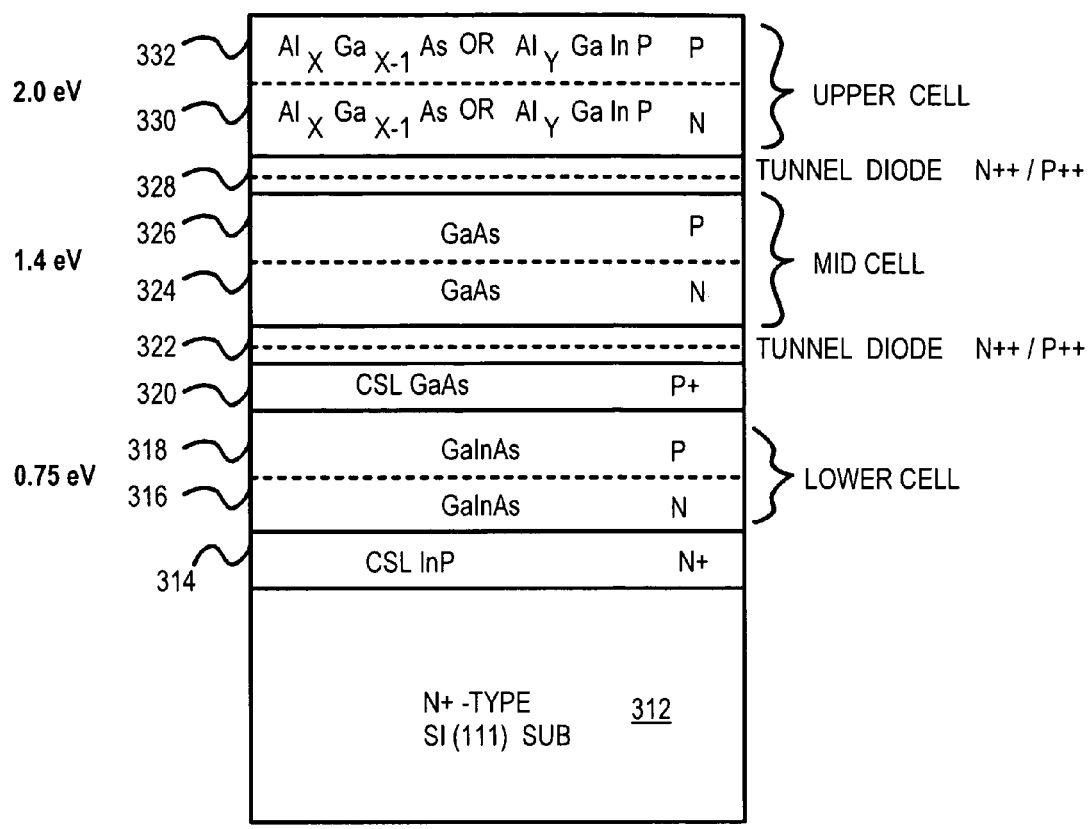
FIG. 13 shows a 3-junction solar cell with Silicon (111) as the passive bottom supporting substrate.

FIG. 13 shows a 3-junction solar cell with Silicon (111) as the passive bottom supporting substrate. Si (111) substrate 312 is a n+ substrate which has low resistivity and can make contact to a metal electrode on the backside. No p-n junction is formed in Si (111) substrate 312 since silicon's bandgap of 1.1 eV is too high to use as the lowest energy junction in this embodiment.

Rather than use GaAs epi film 206, InP epi film 314 is formed on the surface of the Si (111) substrate, and when grown at low temperature forms a coincidence-site lattice (CSL) with few defects. InP and GaAs have similar properties, although InP has a somewhat larger lattice constant and is as ideal as GaAs for the initial layer on Si (111).

A lower cell p-n junction is formed by n-type GaInAs lower-cell layer 316 and p-type GaInAs lower-cell layer 318. GaInAs has a very low bandgap of 0.75 eV, allowing for long wavelengths of light to be converted to electricity, improving efficiency. $GaIn_{0.53}As$ has a lattice constant about the same as that of InP.

A GaAs coincidence-site lattice (CSL) layer is formed over p-type $GaIn_{0.53}As$ lower-cell layer 318 at a low growth temperature to ensure a low-defect transition from GaInAs to GaAs, which have different lattice constants. GaAs CSL layer 320 has a p+ doping. After GaAs CSL layer 320 has been grown, lower tunnel diode 322 is formed by GaAs layers similar to p+ tunnel-diode layer 294 and n+ tunnel-diode layer 292 of FIG. 14. Lower tunnel diode 322 electrically connects the middle cell to the lower cell.

The middle cell is formed by a p-n junction in GaAs, which has a bandgap of 1.42 eV. N-type GaAs middle-cell layer 324 and p-type GaAs middle-cell layer 326 are thicker layers than for the tunnel diode, and have few defects since GaAs is grown over other GaAs or similar layers.

Figure 14:
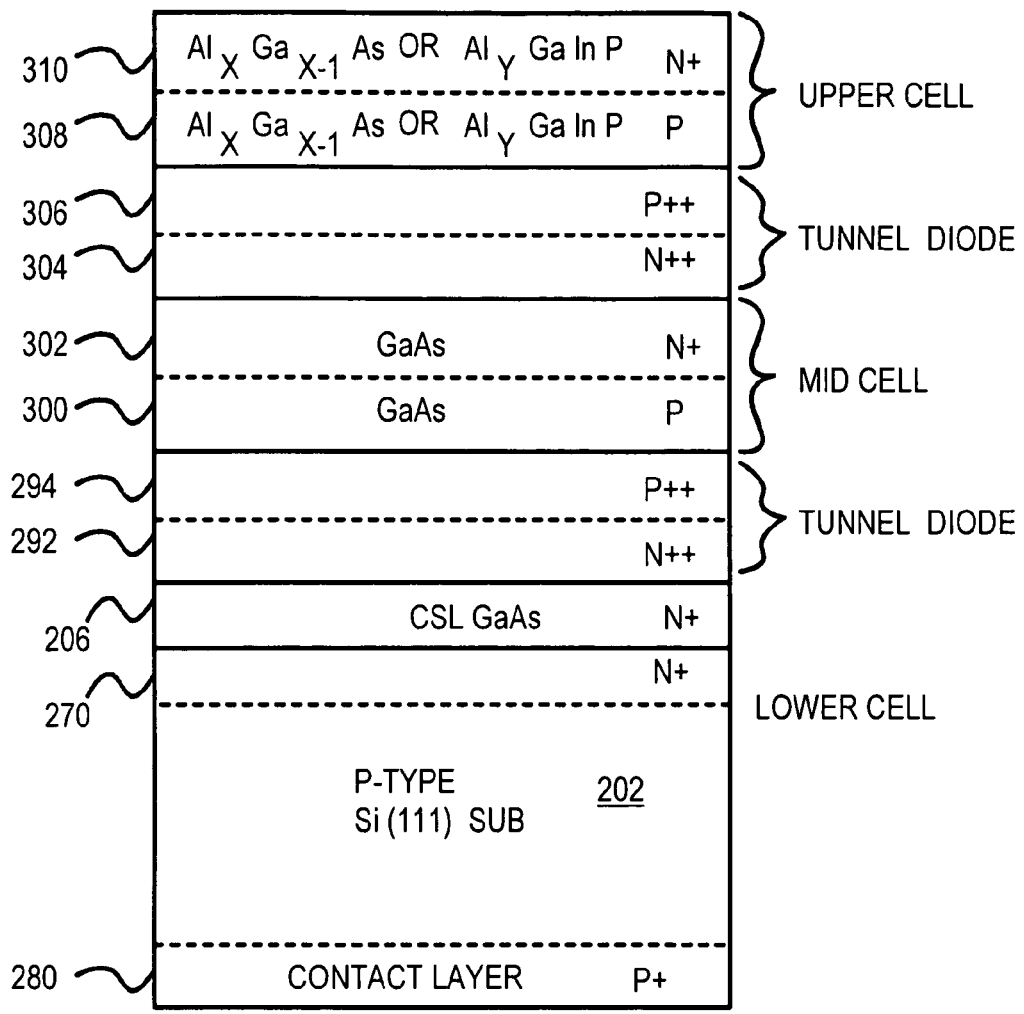
FIG. 14 shows a 3-junction solar cell with Silicon (111) as the active bottom cell and supporting substrate.

Upper tunnel diode 328 is formed from n+ and p+ tunnel-diode layers similar to layers 304, 306 of FIG. 14, although the doping order is reversed. These layers can be formed as described for GaInP tunnel-diode layer 282 and $Al_{0.37}GaAs$ tunnel-diode layer 284 in FIGS. 11-12. Upper tunnel diode 328 electrically connects the middle cell to the upper cell.

The upper cell is formed by a p-n junction in n-type upper-cell layer 330 and p-type upper-cell layer 332. Layers 330, 332 are thicker layers than for the tunnel diodes, and may be similar to top cell p layer 274 and top cell n layer 276 of FIGS. 11-12. Layers 330, 332 may be formed from a $Al_XGa_{1-X}As$ layer, where X is 0.37, or from a $Al_YGa_{0.5-Y}In_{0.5}P$ layer, where Y is between 0 and 0.25.

The bandgap of each cell can be adjusted by the alloy compositions chosen, although the lattice constants must not differ too much from the underlying layer to prevent dislocations and strain. These layers have few defects since these III-V alloys are grown over other GaAs or similar layers.

The bandgap of the upper cell can be adjusted to as higher as 2.0 eV with $Al_XGa_{1-X}As$ or $Al_YGa_{0.5-Y}In_{0.5}P$, which captures quite short wavelengths of the solar spectrum. The middle cell uses GaAs, which has a bandgap of 1.4 eV. The lower cell uses $GaIn_{0.53}As$, which has a bandgap of 0.75 eV. The three bandgaps, 2.0, 1.4, and 0.75 eV divide the solar spectrum into large segments that can increase the efficiency of the solar cell device.

FIG. 14 shows a 3-junction solar cell with Silicon (111) as the active bottom cell and supporting substrate. Increased efficiency may be achieved by using more junctions with different bandgaps to split up the solar spectrum into more pieces. When 3 junctions are used, the thickness of the upper junction layers can be reduced to allow more light to pass through to the lower junction. This allows higher-energy photons that would be absorbed by the upper cells to reach the lower cell. Current from each of the 3 cells is then more evenly matched.

Si (111) substrate 202 is a p-type substrate with p+ contact layer 280 formed on its backside by Al or B diffusion. N+ diffusion layer 270 is formed inside the top of Si (111) substrate 202 by diffusion of As from GaAs epi film 206. A lower cell p-n junction is formed within p-type Si (111) substrate 202 by N+ diffusion layer 270 and has a bandgap of 1.1 eV.

GaAs epi film 206 is a coincidence-site lattice (CSL) with few defects, and has n+ doping so that current may pass from N+ diffusion layer 270 to n+ tunnel-diode layer 292, which can be thin layers of GaInP. P+ tunnel diode layer 294 can also be $Al_{0.37}GaAs$, which has a good lattice match to GaAs epi film 206.

P+ tunnel-diode layer 294 and n+ tunnel-diode layer 292 form a lower tunnel diode that electrically connects the middle cell to the lower cell. The middle cell is formed by a p-n junction in GaAs, which has a bandgap of 1.42 eV. P-type GaAs middle-cell layer 300 and n-type GaAs middle-cell layer 302 are thicker layers than for the tunnel diode, and have few defects since GaAs is grown over other GaAs or similar layers.

N+ tunnel-diode layer 304 and p+ tunnel-diode layer 306 form an upper tunnel diode that electrically connects the middle cell to the upper cell. These layers can be formed as described for GaInP tunnel-diode layer 282, $Al_{0.37}$GaAs tunnel-diode layer 284 in FIGS. 11-12.

The upper cell is formed by a p-n junction in p-type upper-cell layer 308 and n+ upper-cell layer 310. Layers 308, 310 are thicker layers than for the tunnel diodes, and may be similar to top cell p layer 274 and top cell n layer 276 of FIGS. 11-12. Layers 308, 310 may be formed from a $Al_xGa_{1-x}As$ layer, where X is 0, or from a $Al_yGa_{0.5-y}In_{0.5}P$ layer, where Y is between 0 and 0.25. The bandgap of the upper cell can be adjusted by the alloy compositions chosen, although the lattice constants must not differ too much from the underlying p+ tunnel-diode layer 306 to prevent dislocations and strain. These layers have few defects since these III-V alloys are grown over other GaAs or similar layers.

Figure 15:
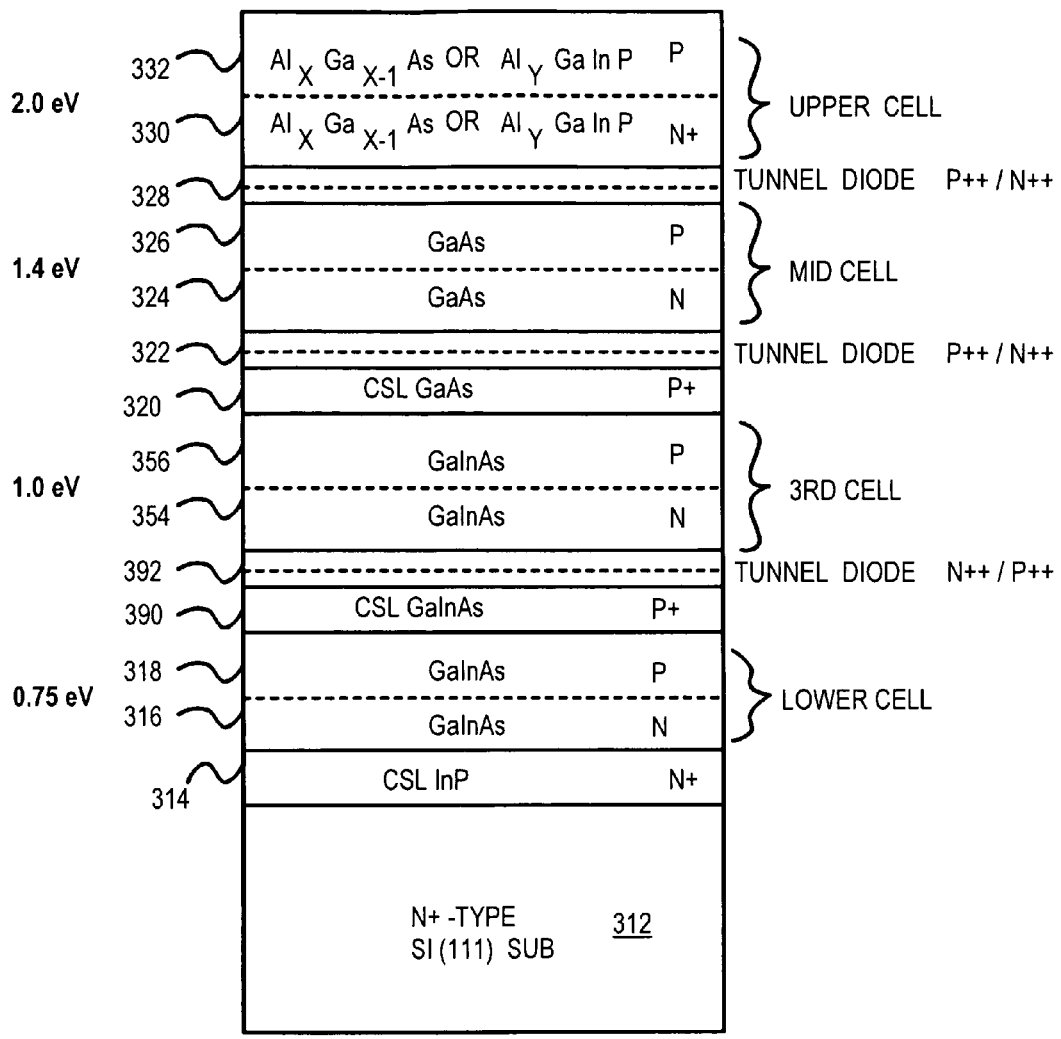
FIG. 15 shows a 4-junction solar cell with Silicon (111) as the passive bottom supporting substrate.

FIG. 15 shows a 4-junction solar cell with Silicon (111) as the passive bottom supporting substrate. This structure is similar to that described for FIG. 13. However, an additional p-n junction cell marked "3RD Cell" is added. An additional tunnel diode and an additional CSL layer also added.

P-type GaInAs lower-cell layer 318 and n-type GaInAs lower-cell layer 316 are formed as described for FIG. 13. Then GaInAs CSL layer 390 is grown with a p+ doping. GaInAs CSL layer 390 has a lattice constant of 0.575 nm, which is about half way between the lattice constants of GaAs (0.565 nm) and $GaIn_{0.53}As$ (0.585 nm). Tunnel diode 392 is formed over GaInAs CSL layer 390 using GaInAs.

The third cell is formed by growing GaInAs layers over tunnel diode 392. The n-type layer is under the p-type layer in the third cell. However, the alloy composition for the third cell is different than that for the bottom cell, although both use GaInAs. The different alloy compositions produces a higher bandgap of 1.0 eV for the third cell, while only 0.75 eV for the lower cell. For example, a higher proportion of Ga relative to In is used in the $3^{rd}$ cell than in the lower cell.

GaAs CSL layer 320 and lower tunnel diode 322 are then formed over the $3^{rd}$ cell as described for FIG. 13. The middle and upper cells are also formed as described earlier, with bandgaps of 1.4 eV and 2.0 eV. The four bandgaps, 2.0, 1.4, 1.0 and 0.75 eV divide the solar spectrum into large segments that can increase the efficiency of the solar cell device.

As the number of junctions in a multi-junction structure is increased for higher efficiency, the difficulty also increases. It becomes more complicated to optimize for the desired efficiency. For FIG. 13, the upper and middle cells may be current matched with Jsc=15 mA while current matching in the lower cell is ignored. However, the lower cell of FIG. 13 is divided into two cells (3RD and lower cell) in FIG. 15, the lower cell of GaInAs (0.75 eV) and the third cell of GaInAs (1.0 eV). There is only 23 mA to be divided up by these lower two cells. If some of the photons with energy greater than 1.42 eV are allowed to pass into the lower two cells, Jsc=13 mA may be achieved for 4 junctions with current matched. At high solar concentrations, such as 500, Voc=4.21 and efficiency may be 46.5%. Thus the thickness of the top two cells may be reduced to allow some high-energy photons to reach the lower cells and to achieve current matching with the lower cells.

The CSL layers transform the lattice constant between that of the surrounding layers. InP epi film 314 transforms the silicon (111) lattice to InP, which is closer to that lattice constant of $GaIn_{0.53}As$ in n-type GaInAs lower-cell layer 316. $GaIn_{0.26}As$ CSL layer 390 transforms the lattice constant between the two different alloy compositions of GaInAs in the lower and 3RD cells. GaAs CSL layer 320 transforms the lattice constant of GaInAs in the 3RD cell to that of GaAs in the middle cell.

Alternate Embodiments

Several other embodiments are contemplated by the inventor. For example, while devices for use as solar cells have been described, these devices may be used in other applications, such as for light-emitting diodes (LED's), lasers, light or radiation sensors, etc. While devices with 2, 3, or 4 junctions have been described, devices with more junctions could be developed using these teachings due to the low defects in the layers grown over the initial GaAs epi film. The initial film on Si (111) substrate 202 could be GaAs or InP, or could be some other III-V material. The initial CSL such as GaAs epi film 206 that is grown over Si (111) substrate 202 is grown at a lower temperature than other films that are later grown over the initial CSL, except that other CSL layers may also use this lowered temperature. However, all active diode layers grown over the CSL are grown at temperatures optimized for their material properties.

GaP, which has a similar lattice constant as Si, can replace Si(111) for LED applications. By growing a CSL GaAs layer on top of the GaP(111) substrate, successive AlGaInP LED layers can be grown on the GaAs CSL layer, which has the same lattice constant as that of the AlGaInP.

Other layers may be present in an actual solar-cell device, such as a scratch-resistant or weatherproof upper layer, metals for bonding to electrodes, Back Surface Field (BSF) layers, barrier layers, bulk-recombination loss reduction layers, carrier and photon confinement layers and structures, etc.

A solar concentrator such as a lens or mirrors may increase the sunlight on the solar cell and increase current. For example, a 500× concentrator may be used. This concentrator may be necessary in some embodiments for achieving high efficiency. Unconcentrated light may also be used with the invention, although efficiencies may be reduced.

A shorthand notation of alloy compositions has been used in many places in this specification. For example, the $Al_{0.37}$GaAs layer is actually a $Al_{0.37}Ga_{0.63}As$ layer, but the shorthand of not specifying the Ga concentration has been used. Other examples include the $Al_{0.17}$GaAs layer, which really has 0.83 Ga atoms per As atom. GaInAs is really $Ga_xIn_{1-x}As$, as another example, since the total concentrations of the group III elements (Ga and In) must equal the concentration of the group V element (As).

While large ranges of compounds have been given, tighter ranges may yield better devices. For example the $Al_xGa_{1-x}As$ layer has good results for X=0.17 and X=0.37, so a range of X between 0.1 and 0.6 may be used.

While specific specifications of materials have been given, such as for FIGS. 11-12, these are examples only. Other specifications may be substituted, such as different resistivity values of the substrate, doping densities and alloy compositions of various layers, layer thicknesses, diffusion elements, gases used, etc. The exact values of thicknesses, alloy compositions, and dopings may be determined and adjusted in practice by a manufacturing engineer or device designer using standard optimization and manufacturing techniques. Likewise the exact temperatures used may vary and be adjusted by process engineers for a variety of reasons. However, all active diode layers, such as for solar-cell junctions and for tunnel diodes, that are grown over and above the CSL, are grown at temperatures higher than the CSL growth temperature. Different CSL layers may be grown at different temperatures from each other, yet still be lower than growth temperatures of active diode layers. The lower CSL growth temperature promotes sideways growth of an initial layer across the terraces, rather than multiple layers upward. The width of the terraces may be ten times the thickness of the CSL layer, although this may vary as terraces vary in size. The terraces are atomically flat surfaces between steps or ledges that abruptly change to a level that is a significant portion of a lattice constant in thickness.

Si (111) substrate 202 may be reduced in thickness for some weight-sensitive application, such as for use in space satellites. Material from the back of Si (111) substrate 202 may be removed by grinding or other methods. The multi-junction devices may be integrated with other devices or circuits. Rather than form the p-n junction in Si (111) substrate 202 by diffusion from the top, from GaAs epi film 206, a backside-diffusion may be used. The top cell may be reduced in thickness to allow light to pass through to lower cells for better current matching. Cells and diodes may have a graded dopant profile, such as having both a p and a p+ region in the same layer. This can act as a BSF in some cases.

While various growth mechanisms and theories have been described, other growth mechanisms and theories may exist. These mechanisms and theories have been described herein to describe the current understanding of why the invention produces lower defect densities, but it is possible that these mechanisms and theories are incomplete or faulty. However, the results of the invention still apply regardless of any changes in understanding of these underlying physical mechanisms.

GaAs epi film 206 is substantially mono-crystalline, rather than polycrystalline. The crystal domain boundaries in a polycrystalline material create defect densities substantially above $5 \times 10^5$. It is possible for GaAs epi film 206 to have a few crystal domain boundaries, such as 1 per mm, especially over a large surface area, and still be considered to be mono-crystalline. The Ga and As atoms of GaAs epi film 206 fit into crystal lattice sites of the underlying Si (111) substrate 202 and thus both the silicon and GaAs are considered to be part of the same crystal.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A mono-crystalline silicon III-V semiconductor device comprising:
    a Si (111) substrate comprising a single crystal of silicon with a (111) orientation for a major top surface;
    a coincidence-site lattice (CSL) layer grown over the major top surface of the Si (111) substrate, the CSL layer being a III-V epitaxial layer;
    wherein the III-V epitaxial layer is a GaAs epitaxial layer or a InP epitaxial layer;
    wherein the CSL layer is a continuation of the single crystal of silicon in a III-V compound material, and wherein the CSL layer has the (111) orientation;
    a tunnel diode layer, grown over the CSL layer, the tunnel diode layer having a p+ doped layer and a n+ doped layer that are sufficiently thin and highly doped to enable reverse-biased current to flow vertically through the tunnel diode layer without damage to the device;
    a top cell layer, grown over the tunnel diode layer, having an n-doped layer and a p-doped layer, forming a light-absorbing p-n diode that generates current when exposed to light of an upper bandgap energy; and
    a diffusion layer in the Si (111) substrate under the CSL layer, the diffusion layer having an opposite doping polarity as a doping polarity of the Si (111) substrate, the diffusion layer and the Si (111) substrate forming a substrate light-absorbing p-n diode that generates current when exposed to light of a lower bandgap energy;
    wherein the upper bandgap energy is greater than the lower bandgap energy;
    wherein current is generated in both the top cell layer and in the Si (111) substrate when light is absorbed,
    whereby the CSL layer and the Si (111) substrate both have the (111) orientation.

2. The mono-crystalline silicon III-V semiconductor device of claim 1 wherein the CSL layer has fewer than $5 \times 10^5$ defects per $cm^2$ of surface area.

3. The mono-crystalline silicon III-V semiconductor device of claim 2 wherein a dopant of the diffusion layer is supplied by the CSL layer during growth of the CSL layer, the dopant having the opposite doping polarity;
    wherein the diffusion layer in the Si (111) substrate is formed when the CSL layer is grown;
    wherein the CSL layer has the opposite doping polarity;
    wherein the p+ doped layer of the tunnel diode layer is above the n+ doped layer of the tunnel diode layer;
    wherein the p-doped layer of the top cell layer is below the n-doped layer of the top cell layer.

4. The mono-crystalline silicon III-V semiconductor device of claim 3 wherein the dopant is As and the opposite polarity type is n;
    wherein the Si (111) substrate is a p-type substrate.

5. The mono-crystalline silicon III-V semiconductor device of claim 2 wherein the top cell layer comprises an $Al_XGa_{1-X}As$ layer, where X is between 0 and 1, or a $Al_YGa_{0.5-Y}In_{0.5}P$ layer, where Y is between 0 and 0.25.

6. The mono-crystalline silicon III-V semiconductor device of claim 5 wherein X is within 0.1 of 0.17 or of 0.37.

7. The mono-crystalline silicon III-V semiconductor device of claim 5 wherein the tunnel diode layer comprises the n+ doped layer of GaInP layer and the p+ doped layer of $Al_XGa_{1-X}As$ layer, where X is within 0.1 of 0.37.

8. The mono-crystalline silicon III-V semiconductor device of claim 2 wherein the CSL layer, the tunnel diode layer, and the top cell layer are all epitaxial layers that are substantially mono-crystalline.

9. The mono-crystalline silicon III-V semiconductor device of claim 2 wherein the CSL is grown at a CSL growth temperature, the CSL growth temperature causing the CSL layer to grow horizontally across the major top surface of the Si (111) substrate to substantially cover the major top surface before growing vertically, wherein vertical growth is limited to a thickness less than two times a lattice constant of the CSL layer;
wherein the top cell layer and the tunnel diode layer are grown at diode growth temperatures that are higher than the CSL growth temperature;
wherein the diode growth temperature is sufficiently high to cause growth.

10. The mono-crystalline silicon III-V semiconductor device of claim 2 wherein the reverse-biased current in the tunnel diode layer flows by quantum-mechanical tunneling;
wherein the top cell layer is a GaAs layer;
a second tunnel diode layer, grown over the top cell layer, the second tunnel diode layer having a p+ doped layer and a n+ doped layer that are sufficiently thin and highly doped to enable reverse-biased current to flow vertically through the second tunnel diode layer without damage to the device;
a second top cell layer, grown over the second tunnel diode layer, having an n-doped layer and a p-doped layer, forming a light-absorbing p-n diode that generates current when exposed to light of a second upper bandgap energy;
wherein the second upper bandgap energy is greater than the upper bandgap energy,
whereby three light-absorbing junctions are formed and connected by the tunnel diode layer and the second tunnel diode layer.

11. The mono-crystalline silicon III-V semiconductor device of claim 10 wherein the second top cell layer comprises an $Al_XGa_{1-X}As$ layer, where X is between 0.1 and 0.6, or a $Al_YGa_{0.5-Y}In_{0.5}P$ layer, where Y is between 0 and 0.25.

12. The mono-crystalline silicon III-V semiconductor device of claim 2 wherein a plane of the major top surface of the Si (111) substrate passes through three corner atoms of a basic cube of a face-centered-cubic (FCC) structure, wherein the basic cube has exactly 6 outer surfaces.

13. The mono-crystalline silicon III-V semiconductor device of claim 2 wherein the major top surface is a vicinal surface that comprises terraces separated by steps, wherein the terraces are atomically flat surfaces, and wherein the steps have a height of $1/SQRT(3)$ times a lattice constant of Silicon.

14. A multi-junction device comprising:
a Si (111) substrate having a (111) orientation for a top surface, the top surface having atomically-flat terraces separated by steps, wherein steps have a step height of a lattice constant of silicon divided by a square root of 3;
a GaAs epi film grown over the terraces of the top surface of the Si (111) substrate at a first temperature that causes the GaAs epi film to grow horizontally from the steps along the terraces wherein the GaAs epi film is a coincidence-site lattice (CSL);
a diffusion layer formed within the Si (111) substrate from As diffusing from the GaAs epi film when the GaAs epi film is grown;
wherein the diffusion layer and the Si (111) substrate form a lower cell that is a p-n junction having a silicon bandgap;
a first tunnel diode having a first n+ layer grown over the GaAs epi film and a first p+ layer grown over the first n+ layer, the first tunnel diode allowing reverse-biased current to flow during operation of the multi-junction device;
a second cell having a second p-type layer grown over the first p+ layer of the first tunnel diode, and a second n-type layer grown over the second p-type layer, the second cell formed from a second III-V compound material and having a p-n junction with a second bandgap;
wherein the GaAs epi film has fewer than $5\times10^5$ defects per square cm of surface area;
wherein the second III-V compound material is $Al_XGa_{1-X}As$, where X is between 0.1 and 0.6, or from a $Al_YGa_{0.5-Y}In_{0.5}P$, where Y is between 0.1 and 0.25;
wherein the first tunnel diode and the second cell have layers that are grown at temperatures higher than the first temperature,
whereby the multi-junction device has two junctions connected by the first tunnel diode and the GaAs epi film creates a low-defect initial film over the Si (111) substrate.

15. The multi-junction device of claim 14 wherein the second cell has a thickness of at least 10 times a thickness of the first tunnel diode.

16. The multi-junction device of claim 14 further comprising:
a second tunnel diode having a third n+ layer grown over the second n-type layer of the second cell, and having a third p+ layer grown over the third n+ layer, the second tunnel diode allowing reverse-biased current to flow during operation of the multi-junction device;
a third cell having a fourth p-type layer grown over the third p+ layer of the second tunnel diode, and having a fourth n-type layer grown over the fourth p-type layer, the second cell formed from a third III-V compound material and having a p-n junction with a third bandgap;
wherein the third bandgap is larger than the second bandgap, and the second bandgap is larger than the silicon bandgap;
wherein the third III-V compound material is $Al_XGa_{1-X}As$, where X is between 0.1 and 0.6, or from a $Al_YGa_{0.5-Y}In_{0.5}P$, where Y is between 0 and 0.25;
wherein the second III-V compound material is GaAs,
whereby three junctions are connected by two tunnel diodes in the multi-junction device.

17. A multiple junction solar cell comprising:
Si (111) substrate means for supporting junctions formed in layers grown over the Si (111) substrate means by epitaxial growth, the Si (111) substrate means having a (111) orientation for a top surface, the top surface having terraces separated by steps, wherein steps have a step height of a lattice constant of silicon divided by a square root of 3, wherein the terraces are atomically-flat;
coincidence-site lattice (CSL) layer means for providing a low-defect layer of III-V material grown over silicon in the Si (111) substrate means, the CSL layer means grown over the terraces of the top surface of the Si (111) substrate means at a first temperature that causes the CSL layer means to grow horizontally from the steps along the terraces to match a lattice of the Si (111) substrate means;

first cell means for generating current when sunlight creates electron-hole pairs in a first p-n junction with a first bandgap, the first p-n junction formed by a n-type first-cell layer and a p-type first-cell layer;

second CSL layer means for adjusting a lattice constant of the first cell means, the second CSL layer means grown over the first cell means;

first tunnel diode means for conducting tunneling current in a reverse direction, the first tunnel diode means having a first n+ layer and a first p+ layer, the first p+ layer being grown over the second CSL layer means;

second cell means for generating current when sunlight creates electron-hole pairs in a second p-n junction with a second bandgap, the second p-n junction formed by a n-type second-cell layer and a p-type second-cell layer, the n-type second-cell layer being grown over the first n+ layer of the first tunnel diode means;

second tunnel diode means for conducting tunneling current in the reverse direction, the second tunnel diode means having a second n+ layer and a second p+ layer, the second p+ layer being grown over the p-type second-cell layer;

third cell means for generating current when sunlight creates electron-hole pairs in a third p-n junction with a third bandgap, the third p-n junction formed by a n-type third-cell layer and a p-type third-cell layer, the n-type third-cell layer being grown over the second n+ layer of the second tunnel diode means;

wherein the third bandgap has a higher energy than the second bandgap, and the second bandgap has a higher energy than the first bandgap.

18. The multiple junction solar cell of claim 17 wherein the CSL layer means comprises InP;
wherein the second CSL layer means comprises GaAs;
wherein the first cell means comprises $GaIn_{0.53}As$;
wherein the second cell means comprises GaAs;
wherein the third cell means comprises $Al_XGa_{1-X}As$, where X is between 0.1 and 1, or $Al_YGa_{0.5-Y}In_{0.5}P$, where Y is between 0 and 0.25.

19. The multiple junction solar cell of claim 17 further comprising:

third CSL layer means for adjusting a lattice constant of the second cell means, the third CSL layer means grown over the second cell means before the second tunnel diode means;

third tunnel diode means for conducting tunneling current in the reverse direction, the third tunnel diode means having a third n+ layer and a third p+ layer, the third p+ layer being grown over the third cell means;

fourth cell means for generating current when sunlight creates electron-hole pairs in a fourth p-n junction with a fourth bandgap, the fourth p-n junction formed by a n-type fourth-cell layer and a p-type fourth-cell layer, the n-type fourth-cell layer being grown over the third n+ layer of the third tunnel diode means;

wherein the fourth bandgap has a higher energy than the third bandgap.

20. The multiple junction solar cell of claim 19 wherein the CSL layer means comprises InP;
wherein the second CSL layer means comprises GaInAs;
wherein the third CSL layer means comprises GaAs;
wherein the first cell means comprises GaInAs having a ratio of Ga to In to achieve the first bandgap of about 0.75 eV;
wherein the second cell means comprises GaInAs having a ratio of Ga to In to achieve the second bandgap of about 1.0 eV;
wherein the third cell means comprises GaAs;
wherein the fourth cell means comprises $Al_XGa_{1-X}As$, where X is between 0.1 and 1, or $Al_YGa_{0.5-Y}In_{0.5}P$, where Y is between 0 and 0.25, having X or Y adjusted to achieve the fourth bandgap of about 2.0 eV.

* * * * *